(12) United States Patent
Cheng et al.

(10) Patent No.: US 7,888,266 B2
(45) Date of Patent: Feb. 15, 2011

(54) BAND GAP MODULATED OPTICAL SENSOR

(75) Inventors: Kangguo Cheng, Guilderland, NY (US); Toshiharu Furukawa, Essex Junction, VT (US); Robert Robison, Colchester, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 12/146,560

(22) Filed: Jun. 26, 2008

(65) Prior Publication Data

US 2009/0325337 A1 Dec. 31, 2009

(51) Int. Cl.
*H01L 21/311* (2006.01)

(52) U.S. Cl. .................. 438/700; 438/199; 438/508; 438/70; 257/E21.051; 257/E21.054; 257/E21.058; 257/E21.085; 257/E21.092; 257/E21.126; 257/E21.127; 257/E21.231; 257/E21.267; 257/E21.32; 257/E21.304; 257/E21.435; 257/E27.133; 257/E27.134

(58) Field of Classification Search .................. 438/31, 438/70, 75, 197, 199, 504, 508, 603, 604, 438/618, 692, 700, 733, 752, 753, 931, 933; 257/E21.32, 42, 51, 54, 58, 85, 92, 126, 127, 257/231, 267, 304, 435
See application file for complete search history.

(56) References Cited

U.S. PATENT DOCUMENTS

| 6,492,694 | B2 | 12/2002 | Noble et al. | |
|---|---|---|---|---|
| 6,856,349 | B1 | 2/2005 | Trevino | |
| 7,220,959 | B2 | 5/2007 | Nishimura | |
| 7,242,069 | B2 * | 7/2007 | Bui et al. | 257/443 |
| 7,250,665 | B1 | 7/2007 | Toros et al. | |
| 7,579,666 | B2 * | 8/2009 | Bui et al. | 257/443 |
| 2005/0104089 | A1 | 5/2005 | Engelmann et al. | |
| 2007/0152292 | A1 | 7/2007 | Toros et al. | |
| 2009/0294812 | A1 * | 12/2009 | Gambino et al. | 257/292 |
| 2009/0303366 | A1 * | 12/2009 | Gambino et al. | 348/308 |
| 2009/0321786 | A1 * | 12/2009 | Cheng et al. | 257/187 |

* cited by examiner

*Primary Examiner*—David Nhu
(74) *Attorney, Agent, or Firm*—Scully, Scott, Murphy & Presser, P.C.; Anthony J. Canale

(57) ABSTRACT

A complementary metal-oxide-semiconductor (CMOS) optical sensor structure includes a pixel containing a charge collection well of a same semiconductor material as a semiconductor layer in a semiconductor substrate and at least another pixel containing another charge collection well of a different semiconductor material than the material of the semiconductor layer. The charge collections wells have different band gaps, and consequently, generate charge carriers in response to light having different wavelengths. The CMOS sensor structure thus includes at least two pixels responding to light of different wavelengths, enabling wavelength-sensitive, or color-sensitive, capture of an optical data.

20 Claims, 14 Drawing Sheets

BAND GAP MODULATED OPTICAL SENSOR

CROSS REFERENCE TO RELATED APPLICATIONS

The present application is related to co-pending U.S. application Ser. No. 12/146,575, which is incorporated herein by reference.

FIELD OF THE INVENTION

The present invention relates to semiconductor structures, and more particularly to semiconductor structures having a band gap modulated optical sensor, and methods of manufacturing the same.

BACKGROUND OF THE INVENTION

A pixel sensor comprises an array of pixel sensor cells that detects two dimensional signals. Pixel sensors include image sensors, which may convert a visual image to digital data that may be represented by a picture, i.e., an image frame. The pixel sensor cells are unit devices for the conversion of the two dimensional signals, which may be a visual image, into the digital data. A common type of pixel sensors includes image sensors employed in digital cameras and optical imaging devices. Such image sensors include charge-coupled devices (CCDs) or complementary metal oxide semiconductor (CMOS) image sensors.

While complementary metal oxide semiconductor (CMOS) image sensors have been more recently developed compared to the CCDs, CMOS image sensors provide an advantage of lower power consumption, smaller size, and faster data processing than CCDs as well as direct digital output that is not available in CCDs. Also, CMOS image sensors have lower manufacturing cost compared with the CCDs since many standard semiconductor manufacturing processes may be employed to manufacture CMOS image sensors. For these reasons, commercial employment of CMOS image sensors has been steadily increasing in recent years.

Referring to FIG. 1, an exemplary prior art semiconductor structure comprises an image sensor element comprising three pixels that are sensitive to three different wavelength of light. The wavelength-dependent sensitivity of the pixels is effected by placing color filter materials in the optical path in each of the pixels. For example, a first pixel 200A may be sensitive to a first wavelength range corresponding to red light, e.g., around 680 nm. A second pixel 200B may be sensitive to a second wavelength range corresponding to yellow light, e.g., around 575 nm. A third pixel 200C may be sensitive to a third wavelength range corresponding to green light, e.g., 510 nm. A red filter 190A is provided in the optical path of the first pixel 200A to pass light in the first wavelength range and to block light outside the first wavelength range. A yellow filter 190B is provided in the optical path of the second pixel 200B to pass light in the second wavelength range and to block light outside the second wavelength range. A green filter 190C is provided in the optical path of the third pixel 200C to pass light in the third wavelength range and to block light outside the third wavelength range.

Each pixel is formed on a semiconductor substrate 108 employing semiconductor processing methods known in the art. The semiconductor substrate 108 comprises a heavily-doped semiconductor layer 110, a lightly-doped semiconductor layer 112, and shallow trench isolation structures 120. The heavily-doped semiconductor layer 110 and the lightly-doped semiconductor layer 112 have a doping of the same conductivity type, which is herein referred to as a first conductivity type. Each pixel comprises a photosensitive diode, which comprises a charge collection well 132 having a doping of a second conductivity type and a portion of the lightly-doped semiconductor layer 112, which is located directly underneath the charge collection well 132 and is herein referred to as a semiconductor portion 114. The second conductivity type is the opposite of the first conductivity type. Each pixel further comprises a floating drain 140 having a doping of the second conductivity type, a gate electrode assembly 160 controlling flow of charges from the charge collection well 132 to the floating drain 140, and an optical lens 172. A back-end-of-line (BEOL) interconnect structure 170 is provided between the semiconductor substrate 108 and the optical lenses 172 to provide structural support and electrical wiring of the components of each pixel (200A, 200B, or 200C). A dielectric layer 180 is provided between the optical lenses 172 and the various color filters (190A, 190B, 190C).

The materials for the various color filters (190A, 190B, 190C) typically comprise acrylate, methacrylate, epoxyacrylate, polyimide, or a combination thereof. The various color filters (190A, 190B, 190C) have refractive indices from about 1.2 to about 1.7, and typically have a thickness from about 300 nm to about 3,000 nm. Each wavelength range requires a different filter material. For an image sensor element having three pixels each sensitive to light in three different wavelength ranges, three different color filter materials need to be repetitively applied and patterned. Repeated application and patterning of different color filter materials increase processing complexity, processing time, and processing cost.

In view of the above, there exists a need for a CMOS image sensor structure that provides pixels having different wavelength sensitivity without employing color filters, and methods of manufacturing the same.

Further, there exists a need for a CMOS image sensor pixel structure that provides such pixels and is compatible with high performance semiconductor devices, and methods of manufacturing the same.

SUMMARY OF THE INVENTION

To address the needs described above, the present invention provides a complementary metal-oxide-semiconductor (CMOS) image sensor structure that includes a band gap modulated charge collection well having a semiconductor alloy material, and methods of manufacturing the same.

In the present invention, a complementary metal-oxide-semiconductor (CMOS) optical sensor structure comprises a pixel containing a charge collection well of a same semiconductor material as a semiconductor layer in a semiconductor substrate and at least another pixel containing another charge collection well of a different semiconductor material than the material of the semiconductor layer. The charge collections wells have different band gaps, and consequently, generate charge carriers in response to light having different wavelengths. The CMOS sensor structure thus includes at least two pixels responding to light of different wavelengths, enabling wavelength-sensitive, or color-sensitive, capture of an optical data.

According to an aspect of the present invention, a method of forming a semiconductor structure is provided, which comprises:

forming a first photosensitive diode in a semiconductor substrate, wherein the first photosensitive diode comprises a first charge collection well and a first semiconductor portion, wherein the first semiconductor portion is formed directly underneath the first charge collection well, comprises a first semiconductor material, and has a doping of a first conductivity type, wherein the first charge collection well comprises the first semiconductor material and has a doping of a second conductivity type, wherein the second conductivity type is the opposite of the first conductivity type; and forming a second photosensitive diode in the semiconductor substrate, wherein the second photosensitive diode comprises a second charge collection well and a second semiconductor portion, wherein the second semiconductor portion is formed directly underneath the second charge collection well, comprises a second semiconductor material, and has a doping of the first conductivity type, wherein the second charge collection well comprises the second semiconductor material and has a doping of the second conductivity type, and wherein the second semiconductor material is different from the first semiconductor material.

In one embodiment, the method further comprises:

providing a semiconductor substrate including a semiconductor layer comprising the first semiconductor material and having a doping of the first conductivity type;

forming a trench in the semiconductor substrate, wherein sidewalls comprising the first semiconductor material of the semiconductor layer are exposed; and depositing the second semiconductor material having a doping of the first conductivity type in the trench in epitaxial alignment with the semiconductor layer.

In another embodiment, the method further comprises implanting dopants of the second conductivity into an upper portion of the second semiconductor material in the trench, wherein a p-n junction is formed within the second semiconductor material in the trench, wherein the second semiconductor material in the trench above the p-n junction constitutes the second charge collection well, and wherein the second semiconductor material in the trench below the p-n junction constitutes the second semiconductor portion.

BRIEF DESCRIPTION OF THE DRAWINGS

FIG. 2 corresponds to a step after formation of gate electrode structures (60A, 60B, 60C). FIG. 3 corresponds to a step after formation of a first trench 29B. FIG. 4 corresponds to a step after formation of a second-semiconductor-material trench fill portion 30B. FIG. 5 corresponds to a step after formation of a second trench 29C. FIG. 6 corresponds to a step after formation of a third-semiconductor-material trench fill portion 30C. FIG. 7 corresponds to a step after formation of an interconnect structure 98.

FIG. 9 corresponds to a step after formation of epitaxial semiconductor material portions (37A, 37B). FIG. 10 corresponds to a step after formation of an interconnect structure 98.

DETAILED DESCRIPTION OF THE INVENTION

Figure 1:
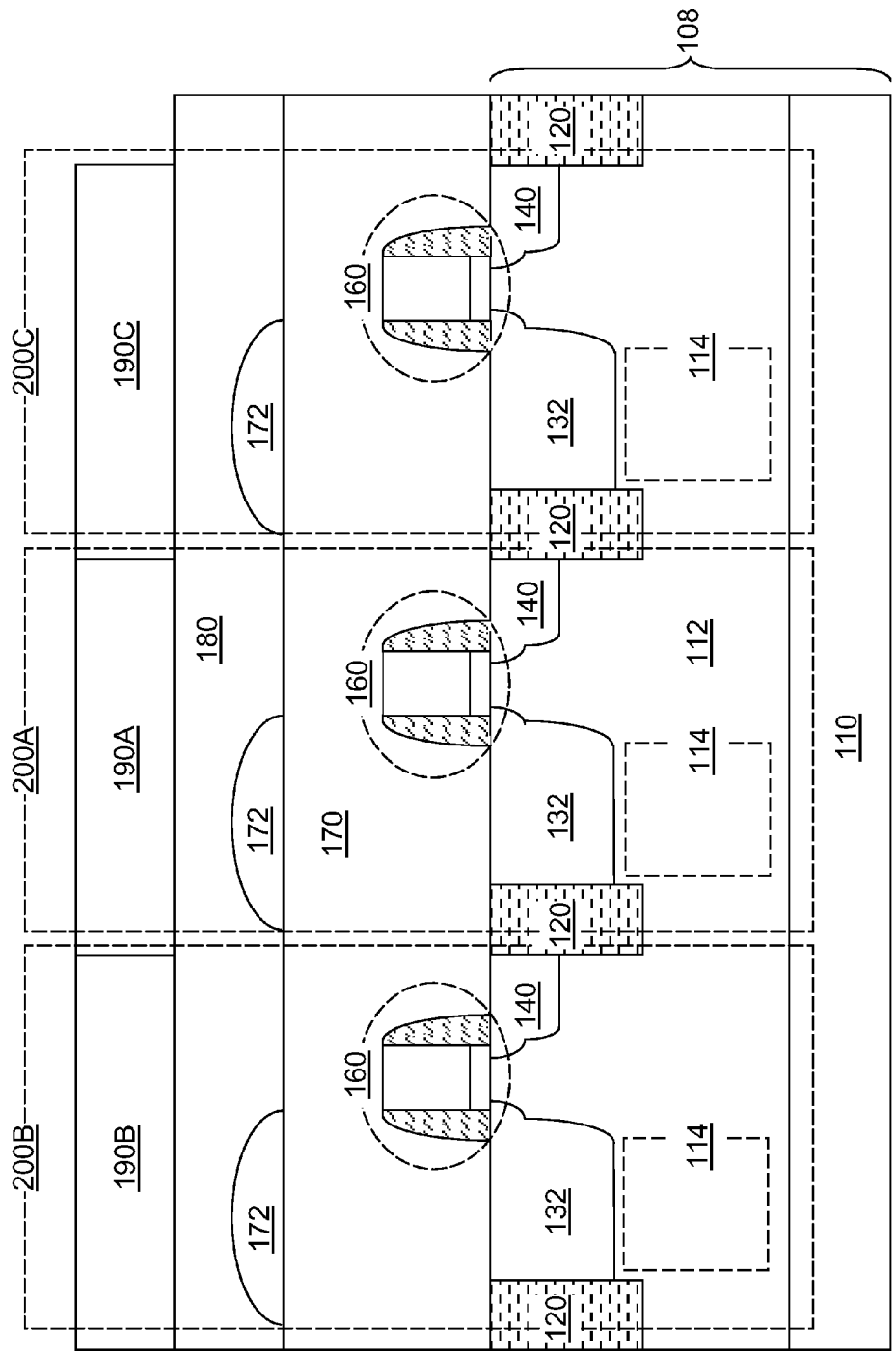
FIG. 1 is a vertical cross-section of an exemplary prior art semiconductor structure comprising an image sensor element comprising three pixels that are sensitive to three different wavelength of light.

As stated above, the present invention relates to semiconductor structures having a band gap modulated optical sensor, and methods of manufacturing the same. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Figure 2:
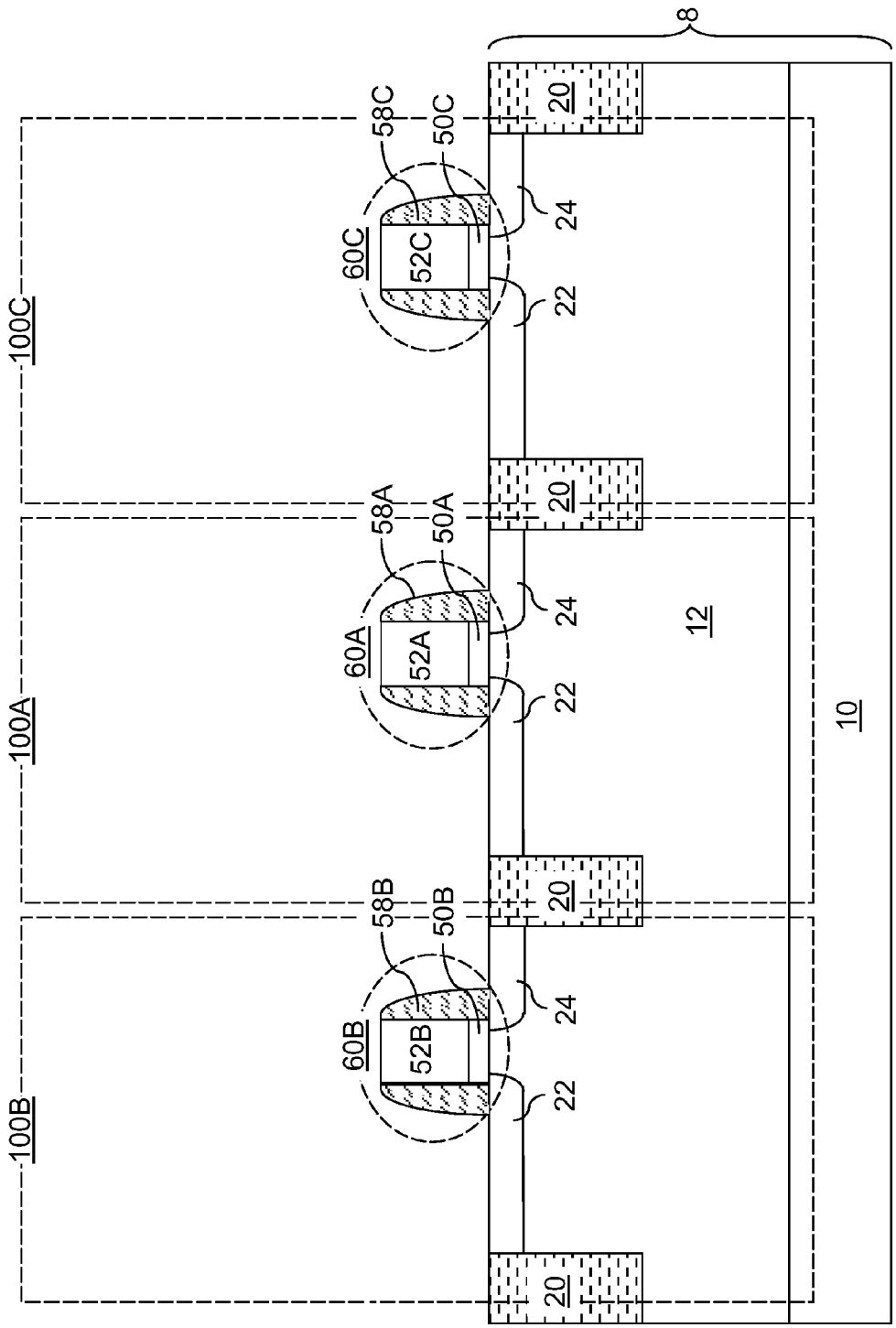
FIGS. 2-7 are sequential vertical cross-sectional views of a first exemplary semiconductor structure according to a first embodiment of the present invention.

Referring to FIG. 2, a first exemplary semiconductor structure according to a first embodiment of the present invention comprises a semiconductor substrate 8 and gate electrode structures. Specifically, the first exemplary semiconductor structure comprises a first pixel region 100A containing a first gate electrode structure 60A, a second pixel region 100B containing a second gate electrode structure 60B, and a third pixel region 100C containing a third gate electrode structure 60C. The semiconductor substrate 8 includes a semiconductor layer 12, which comprises a first semiconductor material and shallow trench isolation structures 20 comprising a dielectric material. The semiconductor layer 12 has a doping of a first conductivity type, which may be p-type or n-type. Optionally, the semiconductor substrate 8 may further include an underlying semiconductor layer 10, which has a doping of the first conductivity type. Typically, the dopant concentration of the underlying semiconductor layer 10, if present, is greater than the dopant concentration of the semiconductor layer 12.

In the present invention, a lightly-doped semiconductor material denotes a semiconductor material having a dopant concentration less than or equal to $1.0 \times 10^{18}/cm^3$. A heavily-doped semiconductor material denotes a semiconductor material having a dopant concentration greater than $1.0 \times 10^{18}/cm^3$. A lightly-doped semiconductor layer denotes a layer of a lightly-doped semiconductor material. A heavily-doped semiconductor layer denotes a layer of a heavily-doped semiconductor material.

The underlying semiconductor layer 10 may comprise a heavily doped semiconductor material having the first conductivity type doping. Typically, the dopant concentration of the underlying semiconductor layer 10 is from about $1.0 \times 10^{18}/cm^3$ to about $1.0 \times 10^{21}/cm^3$, and typically from about $1.0 \times 10^{19}/cm^3$ to about $1.0 \times 10^{20}/cm^3$. Typically, the semiconductor layer 12 comprises a lightly-doped semiconductor material having the first conductivity type doping. For example, the semiconductor layer 12 may have a dopant concentration from about $1.0 \times 10^{14}/cm^3$ to about $1.0 \times 10^{18}/cm^3$, and typically from about $1.0 \times 10^{15}/cm^3$ to about $1.0 \times 10^{17}/cm^3$. The depth of the interface between the semiconductor layer 12 and the underlying semiconductor layer 10, if the underlying semiconductor layer 10 is present, may be from about 1 μm to about 10 μm, and typically from 2 μm to about 5 μm, although lesser and greater depths are also contemplated herein. The depth of the interface is greater than the depth of the bottom surface of the shallow trench isolation structures.

Non-limiting examples of the semiconductor materials that may constitute the underlying semiconductor layer 10 and/or the semiconductor layer 12 include silicon, a silicon germanium alloy portion, silicon, germanium, a silicon-germanium alloy portion, a silicon carbon alloy portion, a silicon-germanium-carbon alloy portion, gallium arsenide, indium arsenide, indium gallium arsenide, indium phosphide, lead sulfide, other III-V compound semiconductor materials, and II-VI compound semiconductor materials. For example, silicon may be employed for the semiconductor material of the underlying semiconductor layer 10 and/or the semiconductor layer 12. Preferably, the semiconductor layer 12 is single crystalline, i.e., the semiconductor material is epitaxially aligned atomically within the entirety of the semiconductor layer 12. More preferably, the underlying semiconductor layer 10 and the semiconductor layer 12 are single crystalline, i.e., the semiconductor material is epitaxially aligned atomically within the entirety of the heavily-doped semiconductor layer 10 and the lightly-doped semiconductor layer 12.

The shallow trench isolation structures 20 are formed, for example, by formation of a dielectric pad layer (not shown) over the semiconductor substrate 8, application and lithographic patterning of a photoresist (not shown), an anisotropic etch that transfers the pattern in the photoresist into exposed portions of the semiconductor layer 12 to form shallow trenches, deposition of a dielectric material inside the shallow trench, and planarization of the dielectric material. The depth of the shallow trench isolation structure 20 may be from about 150 nm to about 600 nm, and typically from about 200 nm to about 500 nm, although lesser and greater thicknesses are also contemplated herein.

The first gate electrode structure 60A comprises a first gate dielectric 50A, a first gate conductor 52A, and a first gate spacer 58A. The second gate electrode structure 60B comprises a second gate dielectric 50B, a second gate conductor 52B, and a second gate spacer 58B. The third gate electrode structure 60C comprises a third gate dielectric 50C, a third gate conductor 52A, and a third gate spacer 58C. Typically, the first through third gate dielectrics (50A-50C) comprise the same dielectric material and have the same thickness. Typically, the first through third gate conductors (52A-52C) comprise the same conductive material and have the same thickness. Typically, the first through the third gate spacers comprise the same dielectric material.

Source extension regions 22 and drain extension regions 24 are formed by implanting dopants of a second conductivity type into exposed upper portions of the semiconductor layer 12 employing the various gate dielectrics (50A-50C) and the various gate conductors (52A-52C) as an implantation mask. A block mask may be employed during the implantation of the dopants of the second conductivity type. The source extension regions 22 and the drain extension regions 24 have a doping of the second conductivity type, which is the opposite of the first conductivity type. The second conductivity type is p-type if the first conductivity type is n-type, and vice versa.

Figure 3:
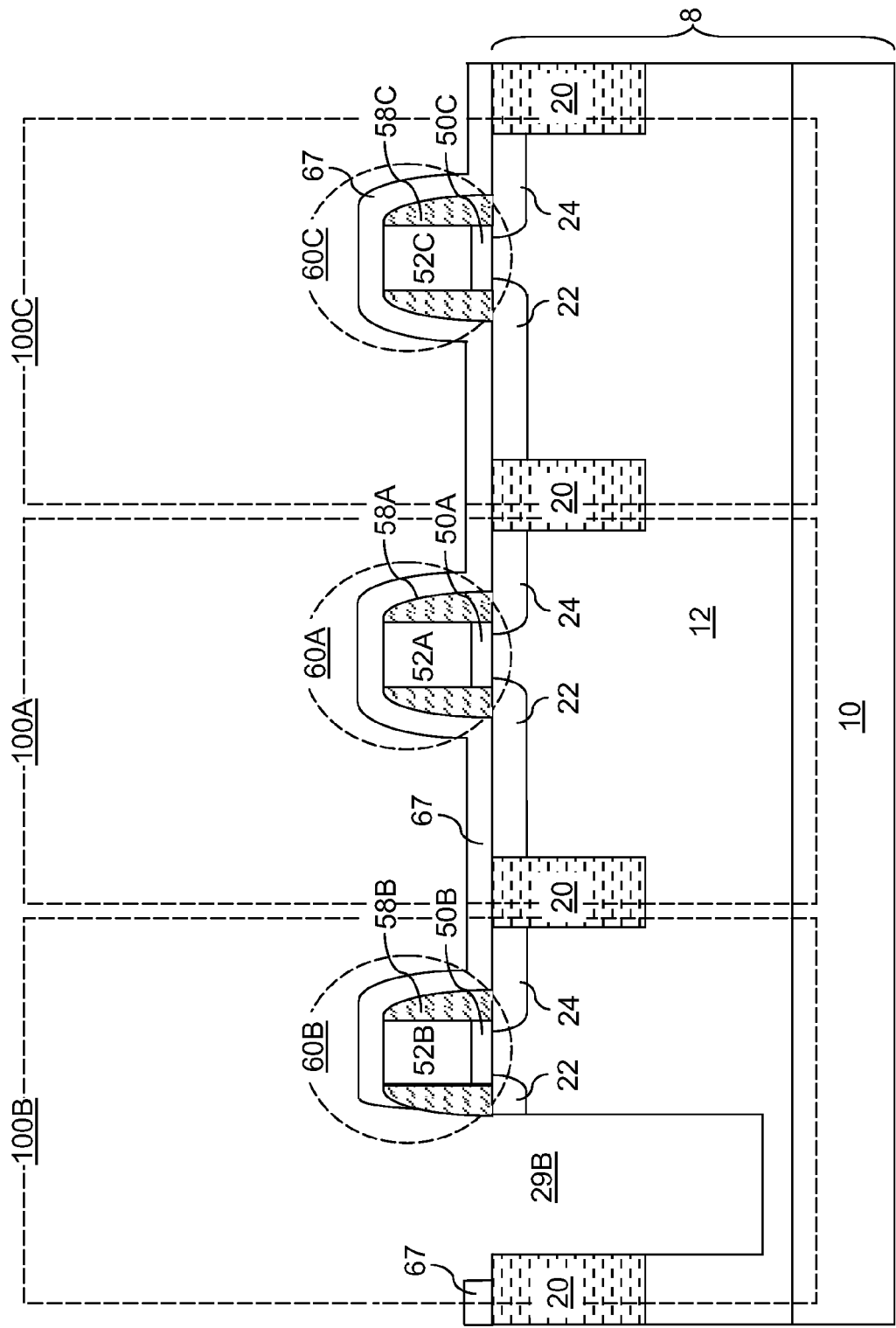

Referring to FIG. 3, a first hard mask layer 67 is formed on the exposed surfaces of the semiconductor substrate 8 and over the various gate electrode structures (60A-60C). The first hard mask layer 67 may comprise a dielectric material such as a dielectric nitride, a dielectric oxide, a dielectric oxynitride, or any combination of those dielectric materials. For example, the first hard mask layer 67 may comprise silicon nitride or silicon oxide. The thickness of the first hard mask layer 67 may be from about 10 nm to about 200 nm, and typically from about 30 nm to about 120 nm, although lesser and greater thicknesses are also contemplated herein. The first hard mask 67 is lithographically patterned to form an opening between the second gate electrode structure 60B and one of the shallow trench isolation structures 20 having an edge within the second pixel region 100B.

A first trench 29B is formed by an anisotropic etch in the semiconductor layer 12 between an edge of the shallow trench isolation structures 20 and an edge of the second gate spacer 58B. The first trench 29B is formed within the second pixel region 100B. The sidewalls of the first trench 29B contain the first semiconductor material of the semiconductor layer 12, which is preferably single crystalline. The sidewalls of the first trench 29B is self-aligned to a sidewall of the shallow trench isolation structures 20 and a bottom portion of a sidewall of the second gate spacer 58B that abut the top surface of the source extension region 22 in the second pixel region 100B. The sidewalls of the first trench 29B may, or may not, have a taper from a vertical line, i.e., from the surface normal of the top surface of the semiconductor substrate 8. The depth of the first trench 29B, as measured from the top surface of the semiconductor substrate 8 to a bottom surface of the first trench 29B, may be from about 200 nm to about 10,000 nm, and typically from about 600 nm to about 3,000 nm, although lesser and greater depths are also contemplated herein. The lateral dimensions of the first trench 29B depends on the sensitivity of a photosensitive diode to be subsequently formed in the second pixel region 100B, and may be from about 100 nm to about 30,000 nm, and typically from about 1,000 nm to about 10,000 nm, although lesser and greater dimensions are also contemplated herein.

Figure 4:
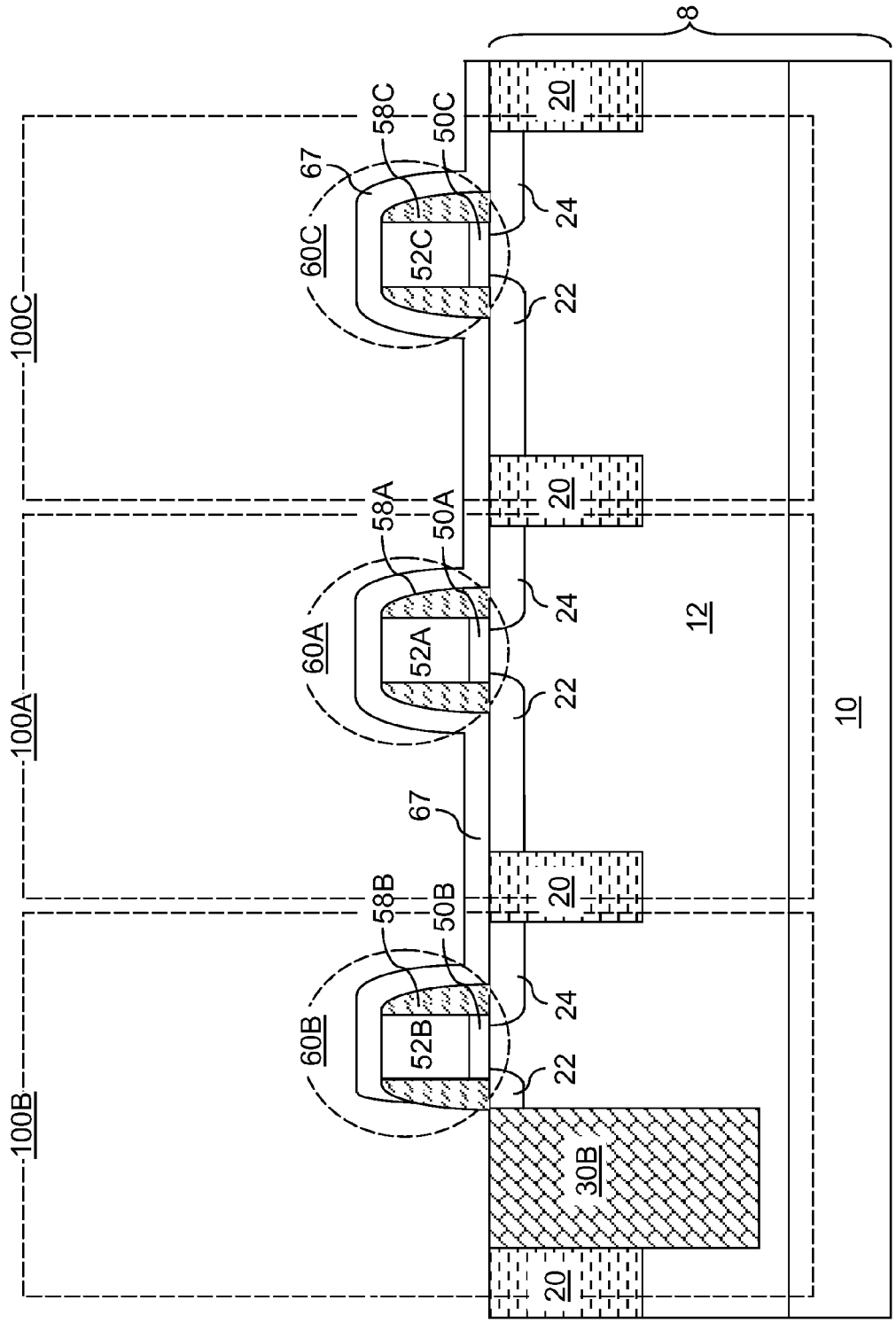

Referring to FIG. 4, a second-semiconductor-material trench fill portion 30B is formed in the first trench 29B by deposition of a second semiconductor material, which is different from the first semiconductor material, i.e., the semiconductor material of the semiconductor layer 12, the source extension regions 22, and the drain extension regions 24. It is noted that the semiconductor layer 12, the source extension regions 22, and the drain extension regions 24 comprise the same semiconductor material despite differences in doping thereamongst. The second semiconductor material may be selected from any material that may be employed for the underlying semiconductor layer 10 and/or the semiconductor layer 12 as described above provided that the second semiconductor material is different from the first semiconductor material. For the purposes of the present invention, a different semiconductor material denotes a semiconductor material including at least one semiconductor material. In other words, two semiconductor materials differing only by the species of electrical dopants are not considered to comprise the same semiconductor material.

The second semiconductor material may, or may not, be an alloy of the first semiconductor material. For example, the first semiconductor material may be silicon and the second semiconductor material may be a silicon germanium alloy or a silicon carbon alloy. Alternately, the first semiconductor material may be a compound semiconductor material having one composition and the second semiconductor material may be another compound semiconductor material having another composition, in which the two compositions differ by at least one element that does not function as an electrical dopant. Yet alternately, the first semiconductor material and the second semiconductor material may comprise an elemental semiconductor material and a compound semiconductor material.

Preferably, the semiconductor layer 12 is single crystalline and the lattice constant of the second semiconductor material is sufficiently matched to the lattice constant of the first semiconductor material to enable epitaxial alignment of the second-semiconductor-material trench fill portion 30B with the semiconductor layer 12. In this case, the entirety of the second-semiconductor-material trench fill portion 30B is epitaxially aligned to the semiconductor layer 12.

The second-semiconductor-material trench fill portion 30B may be formed by selective or non-selective epitaxy. In case the second-semiconductor-material trench fill portion 30B is formed by selective epitaxy, an etchant is provided with reactants to enable selective deposition of the second semiconductor material on semiconductor surfaces, e.g., the sidewalls of the first trench 29B (See FIG. 3), while nucleation is suppressed on dielectric surfaces, e.g., the surfaces of the first hard mask layer 67, surfaces of the shallow trench isolation structures 20, and the surfaces of the second gate spacer 58B. In case the second-semiconductor-material trench fill portion 30B is formed by non-selective epitaxy, the excess second semiconductor material outside the first trench 29B is removed, for example, by a recess etch. Chemical mechanical planarization (CMP) may optionally be employed to facilitate the removal of the excess second semiconductor material outside the first trench 29B.

Preferably, the second-semiconductor-material trench fill portion 30B is formed with in-situ doping with dopants of the first conductivity type. Thus, the second-semiconductor-material trench fill portion 30B has a doping of the first conductivity type, i.e., the same doping type as the semiconductor layer 12. The dopant concentration of the second-semiconductor-material trench fill portion 30B may be from about $1.0 \times 10^{14}/cm^3$ to about $1.0 \times 10^{18}/cm^3$, and typically from about $1.0 \times 10^{15}/cm^3$ to about $1.0 \times 10^{17}/cm^3$, although lesser and greater dopant concentrations are also contemplated herein.

The first hard mask layer 67 may be removed at this step. Preferably, the removal of the first hard mask layer 67 is selective to the various gate spacers (58A-58C).

Figure 5:
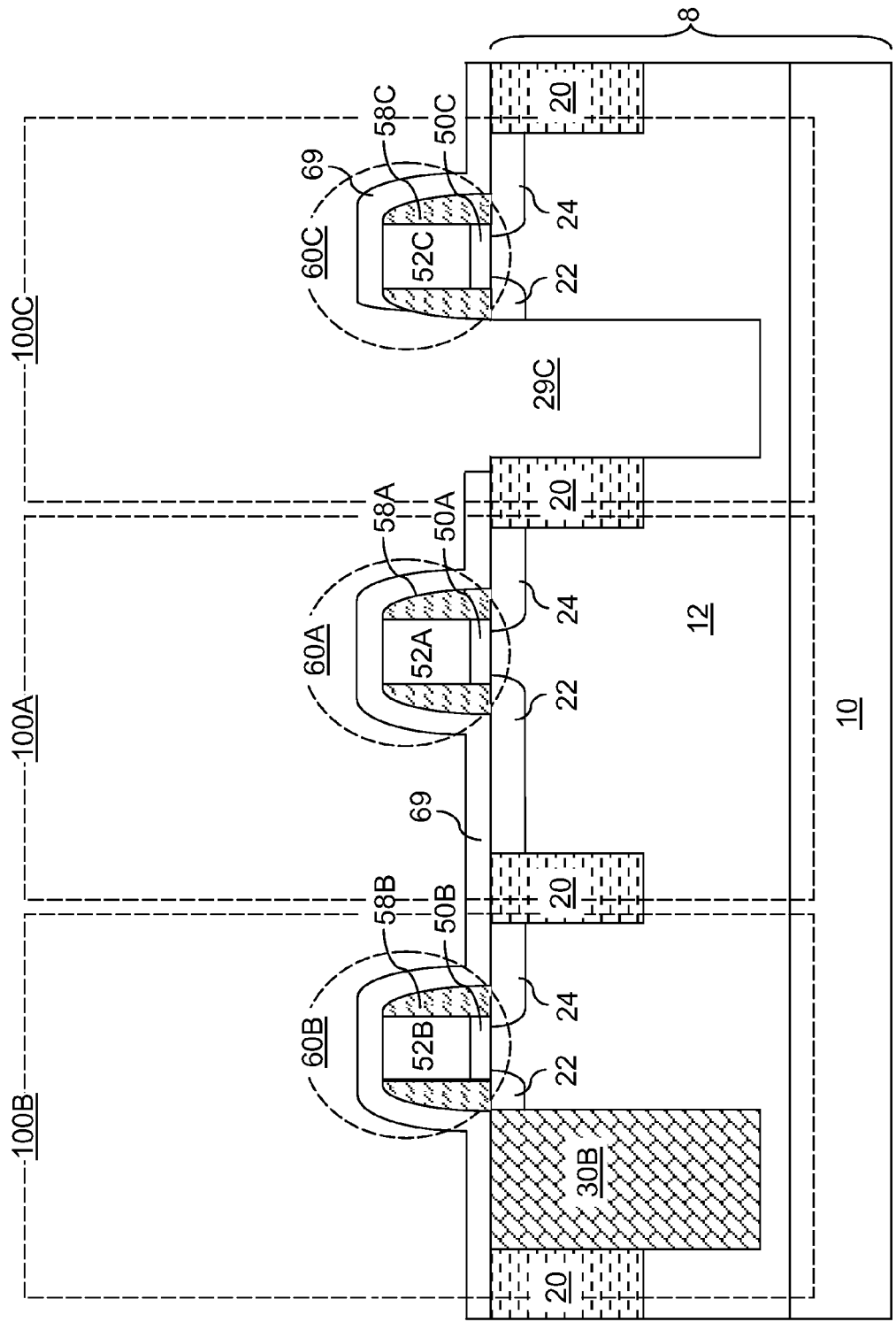

Referring to FIG. 5, a second hard mask layer 69 is formed on the exposed surfaces of the semiconductor substrate 8 and over the various gate electrode structures (60A-60C). The second hard mask layer 69 may comprise such a dielectric material as may be employed for the first hard mask layer 67. The thickness of the second hard mask layer 69 may be from about 10 nm to about 200 nm, and typically from about 30 nm to about 120 nm, although lesser and greater thicknesses are also contemplated herein. The second hard mask 69 is lithographically patterned to form an opening between the third gate electrode structure 60C and one of the shallow trench isolation structures 20 having an edge within the third pixel region 100C.

A second trench 29C is formed by an anisotropic etch in the semiconductor layer 12 within the third pixel region 100C between an edge of the shallow trench isolation structures 20 and an edge of the third gate spacer 58C in the same manner as in the formation of the first trench 29B described above.

Figure 6:
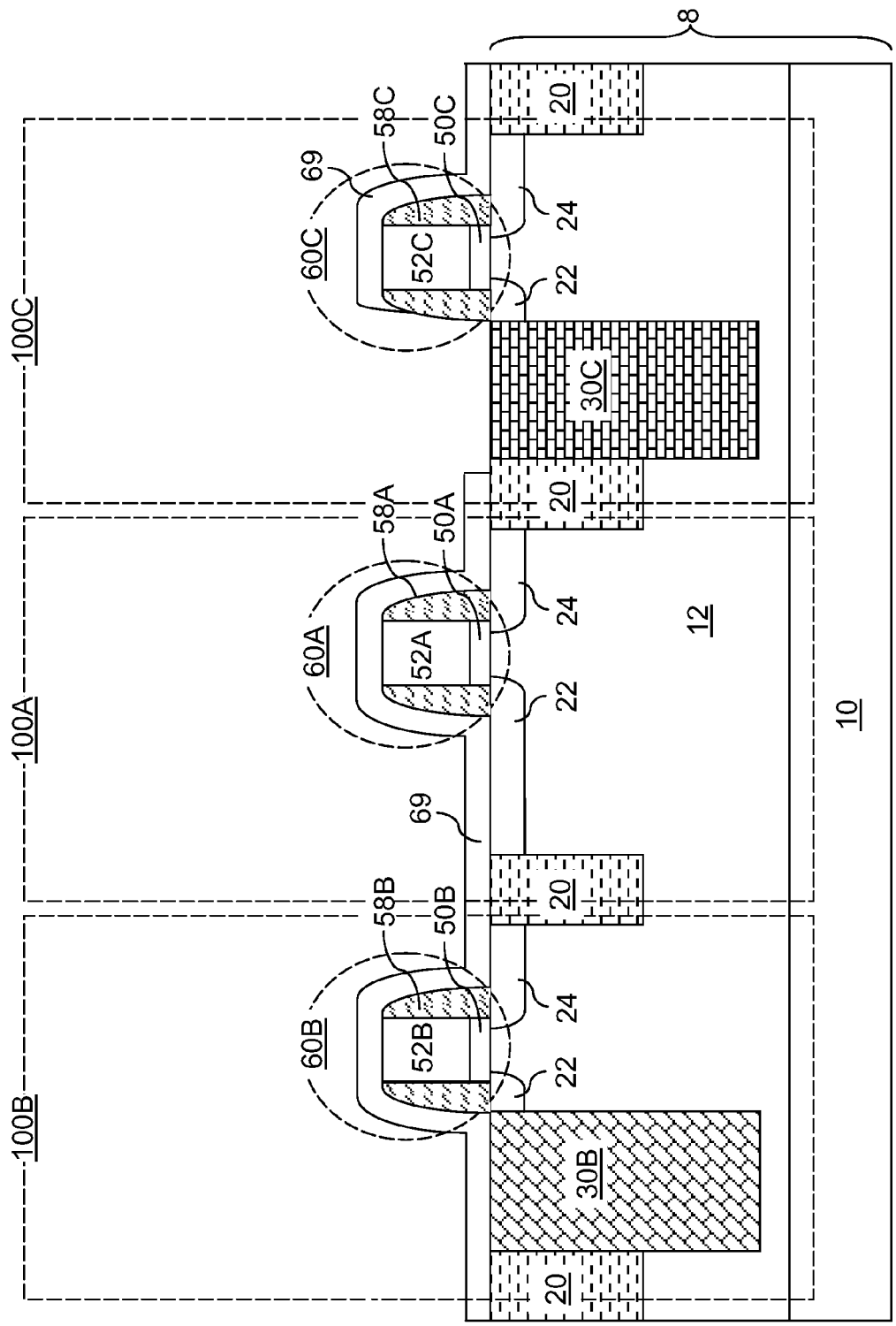

Referring to FIG. 6, a third-semiconductor-material trench fill portion 30C is formed in the second trench 29C by deposition of a third semiconductor material, which is different from the first semiconductor material and the second semiconductor material. The third semiconductor material may be selected from any material that may be employed for the underlying semiconductor layer 10 and/or the semiconductor layer 12 as described above provided that the second semiconductor material is different from the first semiconductor material and the second semiconductor material.

The third semiconductor material may, or may not, be an alloy of the first semiconductor material or an alloy of the second semiconductor material. For example, the first semiconductor material may be silicon, the second semiconductor material may be a silicon germanium alloy, and the third semiconductor material may be a silicon carbon alloy. Alternately, the first semiconductor material may be a compound semiconductor material having a first composition, the second semiconductor material may be another compound semiconductor material having a second composition, and the third semiconductor material may be yet another compound semiconductor material having a third composition, in which each pair of the first through third compositions differ by at least one element that does not function as an electrical dopant. Yet alternately, the first semiconductor material, the second semiconductor material, and the third semiconductor material comprise at least one elemental semiconductor material and at least one compound semiconductor material.

Preferably, the semiconductor layer 12 is single crystalline and the lattice constant of the third semiconductor material is sufficiently matched to the lattice constant of the first semiconductor material to enable epitaxial alignment of the third-semiconductor-material trench fill portion 30C with the semiconductor layer 12. In this case, the entirety of the third-semiconductor-material trench fill portion 30C is epitaxially aligned to the semiconductor layer 12.

The third-semiconductor-material trench fill portion 30C may be formed by selective or non-selective epitaxy in the same manner as in the formation of the second-semiconductor-material trench fill portion 30B. Preferably, the third semiconductor material portion 30B is formed with in-situ doping with dopants of the first conductivity type. The third-semiconductor-material trench fill portion 30C has a doping of the first conductivity type. The dopant concentration of the third-semiconductor-material trench fill portion 30C may be from about $1.0 \times 10^{14}/cm^3$ to about $1.0 \times 10^{18}/cm^3$, and typically from about $1.0 \times 10^{15}/cm^3$ to about $1.0 \times 10^{17}/cm^3$, although lesser and greater dopant concentrations are also contemplated herein.

Figure 7:
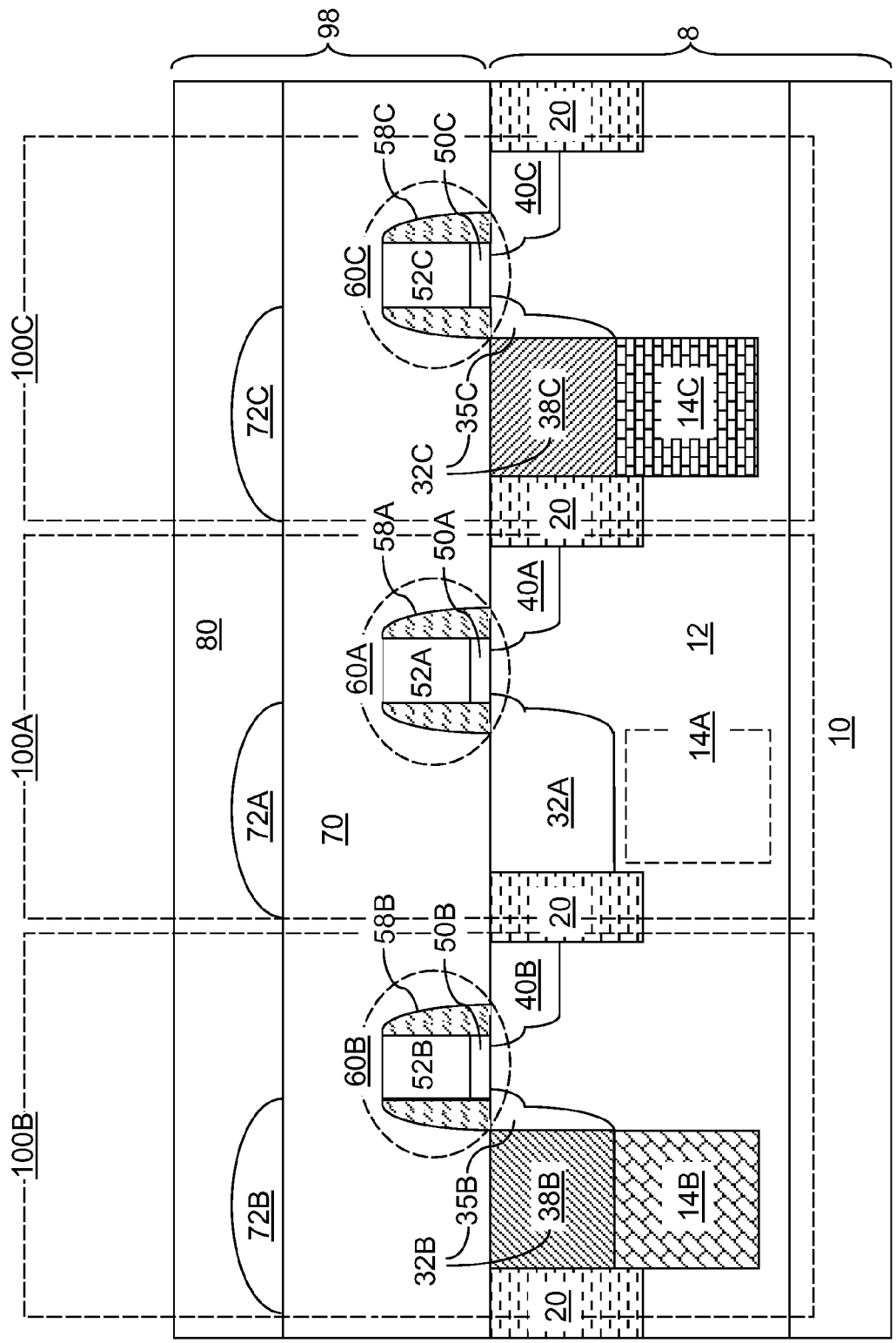

Referring to FIG. 7, dopants of the second conductivity type are implanted by masked ion implantation. Various doped semiconductor regions having edges self-aligned to the gate electrode structures (60A, 60B, 60C) are formed on the top surface of the semiconductor substrate 8. Specifically, a first charge collection well 32A is formed in the first pixel region 100A so that the first charge collection well 32A abuts a sidewall of one of the shallow trench isolation structures 20 and an edge portion of the first gate dielectric 50A. A second charge collection well 32B is formed in the second pixel region 100B so that the second charge collection well 32B abuts a sidewall of another of the shallow trench isolation structures 20 and an edge portion of the second gate dielectric 50B. A third charge collection well 32C is formed in the third pixel region 100C so that the third charge collection well 32C abuts a sidewall of yet another of the shallow trench isolation structures 20 and an edge portion of the third gate dielectric 50C.

The entirety of the first charge collection well 32A comprises the first semiconductor material and has a doping of the second conductivity type. The source extension region 22 within the first pixel region 100A is merged with the first charge collection well 32A. The portion of the bottom surface of the first charge collection well 32A that abuts a sidewall of the shallow trench isolation structures 20 may be located at a depth from about 50 nm to about 500 nm, and typically from about 100 nm to about 300 nm, from the top surface of the semiconductor substrate 8, although lesser and greater depths are also contemplated herein. The dopant concentration of the first charge collection well 32A may be from about $1.0 \times 10^{18}/\text{cm}^3$ to about $1.0 \times 10^{21}/\text{cm}^3$, and typically from about $1.0 \times 10^{19}/\text{cm}^3$ to about $1.0 \times 10^{20}/\text{cm}^3$, although lesser and greater dopant concentrations are also contemplated herein.

A p-n junction is formed between the first charge collection well 32A, which has a doping of the second conductivity type, and the portion of the semiconductor layer 12 abutting the first charge collection well 32A since the semiconductor layer 12 has a doping of the first conductivity type, which is the opposite of the second conductivity type. The portion of the semiconductor layer 12 directly underneath the bottom surface of the first charge collection well 32A is herein referred to as a first semiconductor portion 14A. The depth of the bottom of the first semiconductor portion 14A is the lesser of the depth of the interface between the semiconductor layer 12 and the underlying semiconductor layer 10 and an effective range for diffusion of charge carriers from the bottom of the first charge collection well. Typically, the depth of the bottom of the first semiconductor portion 14A is from about 500 nm to about 5,000 nm.

Depletion regions are formed in each of the first charge collection well 32A and the first semiconductor portion 14A around the p-n junction. The entirety of the first semiconductor portion 14A comprises the first semiconductor material and has a doping of the first conductivity type. The dopant concentration of the first semiconductor portion 14A is typically the same as the dopant concentration of the semiconductor layer 12, e.g., $1.0 \times 10^{14}/\text{cm}^3$ to about $1.0 \times 10^{18}/\text{cm}^3$, and typically from about $1.0 \times 10^{15}/\text{cm}^3$ to about $1.0 \times 10^{17}/\text{cm}^3$, although lesser and greater concentrations are also contemplated herein.

A first floating drain 40A is formed on the opposite side of the first gate electrode structure 60A in the first pixel region 100A. The first floating drain 40A has a doping of the second conductivity type, and is electrically floating when a first transfer transistor, which comprises the first charge collection well 32A, the first floating drain 40A, a first channel therebetween, and the first gate electrode structure 60A, is turned off to enable storage of electrical charges. Preferably, separate implantation masks are employed to independently control the depth of the first charge collection well 32A and the depth of the first floating drain 40A. Preferably, the depth of the first floating drain 40A is less than the depth of the first charge collection well 32A. The dopant concentration of the first floating drain 40A may be from about $1.0 \times 10^{17}/\text{cm}^3$ to about $1.0 \times 10^{21}/\text{cm}^3$, and typically from about $1.0 \times 10^{18}/\text{cm}^3$ to about $5.0 \times 10^{20}/\text{cm}^3$, although lesser and greater dopant concentrations are also explicitly contemplated herein. The depth of the first floating drain 40A, as measured between the top surface of the semiconductor substrate 8 and a flat portion of the bottom surface of the first floating drain 40A, may be from about 30 nm to about 300 nm, and typically from about 60 nm to about 300 nm, although lesser and greater depths are also contemplated herein.

The first semiconductor portion 14A and the first charge collection well 32A collectively constitute a first photosensitive diode (14A, 32A) that generates electron-hole pairs upon illumination. Charge carriers of the second conductivity type are collected in the first charge collection well 32A in proportion to the amount of photons impinging into the first photosensitive diode (14A, 32A). In case the first conductivity type is p-type and the second conductivity type is n-type, electrons are collected in the first charge collection well 32A. In case the second conductivity type is n-type and the second conductivity type is p-type, holes are collected in the first charge collection well 32A. A photon impinging on the first photosensitive diode (14A, 32A) generates an electron-hole pair if the photon interacts with the semiconductor material in the first photosensitive diode (14A, 32A).

The energy of the photon that induces electron-hole pair generation depends on the band gap of the first semiconductor material. The wider the band gap, the greater the energy of a photon that is required to generate an electron-hole pair. For example, the wavelength range of photons for photogeneration of an electron-hole pair is from about 190 nm to about 1,100 nm for silicon, from about 400 nm to about 1,700 nm for germanium, and from about 800 nm to about 2,600 nm for indium gallium arsenide, respectively. A silicon germanium alloy has a narrower band gap than silicon, and the wavelength range for photogeneration of an electron-hole pair in a silicon germanium alloy is shifted toward longer wavelengths relative to the wavelength range for photogeneration of an electron-hole pair in silicon. Conversely, a silicon carbon alloy has a wider band gap than silicon, and the wavelength range for photogeneration of an electron-hole pair in a silicon carbon alloy is shifted toward shorter wavelengths relative to the wavelength range for photogeneration of an electron-hole pair in silicon. The wavelength range that induces photogeneration of an electron-hole pair in the first photosensitive diode (14A, 32A) is herein referred to as a first wavelength range.

If the electron-hole pair is generated within the depletion region of the first photosensitive diode (14A, 32A), the charge carriers (holes and electrons) drift apart due to the kinetic energy imparted to the charge carriers during the photogeneration process. If a minority carrier (a charge carrier of the first conductivity type in the first charge collection well 32A or a charge carrier of the second conductivity type in the first semiconductor portion 14A) enters into the depletion region by drifting, the electric field inherent in the depletion region of the first photosensitive diode (14A, 32A) sweeps the carrier across the p-n junction, which then becomes a majority carrier, i.e., a charge carrier of the first conductivity type in the first semiconductor portion 14A or a charge carrier of the second conductivity type in the first charge collection well 32A, upon crossing the p-n junction, and producing a photocurrent if the circuit is closed, or accumulates charges. Particularly, if the carrier is a carrier of the second conductivity type, the carrier accumulates in the first charge collection well 32A. The amount of charge that accumulates in the first charge collection well 32A is nearly linear to the number of incident photons (assuming the photons have the same energy distribution). If the minority carrier recombines with the majority carriers within the first photosensitive diode (14A, 32A) prior to entering the depletion region, the minority carrier is "lost" through recombination and no current or charge accumulation results.

The first transfer transistor is integrally formed with the first photosensitive diode (14A, 32A) such that the first charge collection well 32A, which comprises a heavily-doped second conductivity type semiconductor material, is also a source of the first transfer transistor. Charge carriers of the second conductivity type, i.e., electrons if the second conductivity type is n-type or holes if the second conductivity type is p-type, accumulate in the first charge collection well 32A when photons are incident on the first photosensitive diode (14A, 32A). When the first transfer transistor is turned on, the charge carriers in the first charge collection well 32A are transferred into the first floating drain 40A, which is a charge holding well and stores electrical charge from the first photosensitive diode (14A, 32A) as data until a read circuit detects the amount of stored charge. Thus, the first charge collection well 32A functions as the source of the first transfer transistor while the first transfer transistor is turned on.

The portion of the second-semiconductor-material trench fill portion 30B that is implanted with the dopants of the second conductivity type constitutes a second-semiconductor-material second charge collection well portion 38B. The portion of the second-semiconductor-material trench fill portion 30B that is not implanted with the dopants of the second conductivity type constitutes a second semiconductor portion 14B. The portion of the semiconductor layer 12 in the second pixel region 100B that is implanted with the dopants of the second conductivity type and adjoining the second-semiconductor-material second charge collection well portion 38B is merged with a portion of the source extension region 22 (See FIG. 6) in the second pixel region 100B to form a first-semiconductor-material second charge collection well portion 35B. The second-semiconductor-material second charge collection well portion 38B and the first-semiconductor-material second charge collection well portion 35B collectively constitute a second charge collection well 32B.

The second-semiconductor-material second charge collection well portion 38B and the second semiconductor portion 14B comprises the second semiconductor material. The entirety of the second charge collection well 32B has a doping of the second conductivity type. The second semiconductor portion 14B has a doping of the first conductivity type. The depth of the second charge collection well 32B is comparable with the depth of the first charge collection well 32A. Preferably, the depth of the second charge collection well 32B is the same as the depth of the first charge collection well 32A. In this case, the second charge collection well 32B and the first charge collection well 32A may be formed simultaneously in the same masked implantation step in which dopants of the second conductivity type are implanted into the semiconductor substrate 8. The dopant concentration of the second charge collection well 32B may be from about $1.0\times10^{18}/cm^3$ to about $1.0\times10^{21}/cm^3$, and typically from about $1.0\times10^{19}/cm^3$ to about $1.0\times10^{20}/cm^3$, although lesser and greater dopant concentrations are also contemplated herein.

A p-n junction is formed between the second charge collection well 32B, which has a doping of the second conductivity type, and the second semiconductor portion 14B. The depth of the bottom of the second semiconductor portion 14B is the same as the depth of the second-semiconductor-material trench fill portion 30B (See FIG. 6) prior to the ion implantation, e.g., from about 200 nm to about 10,000 nm, and typically from about 600 nm to about 3,000 nm, although lesser and greater depths are also contemplated herein.

Depletion regions are formed in each of the second charge collection well 32B and the second semiconductor portion 14B around the p-n junction. The entirety of the second semiconductor portion 14B comprises the second semiconductor material and has a doping of the first conductivity type. The dopant concentration of the second semiconductor portion 14B is about the same as the dopant concentration of the semiconductor layer 12, e.g., $1.0\times10^{14}/cm^3$ to about $1.0\times10^{18}/cm^3$, and typically from about $1.0\times10^{15}/cm^3$ to about $1.0\times10^{17}/cm^3$, although lesser and greater concentrations are also contemplated herein.

A second floating drain 40B is formed on the opposite side of the second gate electrode structure 60B in the second pixel region 100B. The second floating drain 40B has a doping of the second conductivity type, and is electrically floating when a second transfer transistor, which comprises the second charge collection well 32B, the second floating drain 40B, a second channel therebetween, and the second gate electrode structure 60B, is turned off to enable storage of electrical charges. The second floating drain 40B may have the same doping and depth as the first floating drain 40A, and may be formed employing the same processing steps as the first floating drain 40A. Preferably, the second floating drain 40B is formed simultaneously with the first floating drain 40A.

The second semiconductor portion 14B and the second charge collection well 32B collectively constitute a second photosensitive diode (14B, 32B) that generates electron-hole pairs upon illumination. Charge carriers of the second conductivity type are collected in the second charge collection well 32B in proportion to the amount of photons impinging into the second photosensitive diode (14B, 32B). In case the first conductivity type is p-type and the second conductivity type is n-type, electrons are collected in the second charge collection well 32B. In case the first conductivity type is n-type and the second conductivity type is p-type, holes are collected in the second charge collection well 32B. A photon impinging on the second photosensitive diode (14B, 32B) generates an electron-hole pair if the photon interacts with the semiconductor material in the second photosensitive diode (14B, 32B).

The second semiconductor material is selected such that the band gap of the second semiconductor material is different from the band gap of the first semiconductor material. Thus, the second photosensitive diode (14B, 32B) generates electron-hole pairs at a wavelength range that is different from the first wavelength range, which is the wavelength range to which the first photosensitive diode (14A, 32A) responds to. The wavelength range that induces photogeneration of an electron-hole pair in the second photosensitive diode (14B, 32B) is herein referred to as a second wavelength range.

The operating principle of the second photosensitive diode (14B, 32B) is the same as the operating principle of the first photosensitive diode (14A, 32A) as described above except that the second wavelength range is shifted relative to the first wavelength range. For example, the first wavelength range may include yellow light, e.g., a wavelength around 575 nm, while the second wavelength range may include red light, e.g., a wavelength around 680 nm, so that the first photosensitive diode (14A, 32A) and the second photosensitive diode (14B, 32B) are wavelength-sensitive, i.e., color-sensitive.

The second transfer transistor is integrally formed with the second photosensitive diode (14B, 32B) such that the second charge collection well 32B is also a source of the second transfer transistor. The second transfer transistor operates in the same manner as the first transfer transistor.

The portion of the third-semiconductor-material trench fill portion 30C (See FIG. 6) that is implanted with the dopants of the second conductivity type constitutes a third-semiconductor-material third charge collection well portion 38C. The portion of the third-semiconductor-material trench fill portion 30C that is not implanted with the dopants of the second conductivity type constitutes a third semiconductor portion 14C. The portion of the semiconductor layer 12 in the third pixel region 100C that is implanted with the dopants of the second conductivity type and adjoining the third-semiconductor-material third charge collection well portion 38C is merged with a portion of the source extension region 22 in the third pixel region 100C to form a first-semiconductor-material third charge collection well portion 35C. The third-semiconductor-material third charge collection well portion 38C and the first-semiconductor-material third charge collection well portion 35C collectively constitute a third charge collection well 32C.

The third-semiconductor-material third charge collection well portion 38C and the third semiconductor portion 14C comprises the third semiconductor material. The entirety of the third charge collection well 32C has a doping of the second conductivity type. The third semiconductor portion 14C has a doping of the first conductivity type. The depth of the third charge collection well 32C is comparable with the depth of the first charge collection well 32A. Preferably, the depth of the third charge collection well 32C is the same as the depth of the first charge collection well 32A. In this case, the third charge collection well 32C and the first charge collection well 32A may be formed simultaneously in the same masked implantation step in which dopants of the second conductivity type are implanted into the semiconductor substrate 8. The dopant concentration of the third charge collection well 32C may be from about $1.0 \times 10^{18}/cm^3$ to about $1.0 \times 10^{21}/cm^3$, and typically from about $1.0 \times 10^{19}/cm^3$ to about $1.0 \times 10^{20}/cm^3$, although lesser and greater dopant concentrations are also contemplated herein.

A p-n junction is formed between the third charge collection well 32C, which has a doping of the second conductivity type, and the third semiconductor portion 14C. The depth of the bottom of the third semiconductor portion 14A is the same as the depth of the third-semiconductor-material trench fill portion 30C (See FIG. 6) prior to the ion implantation, e.g., from about 200 nm to about 10,000 nm, and typically from about 600 nm to about 3,000 nm, although lesser and greater depths are also contemplated herein.

Depletion regions are formed in each of the third charge collection well 32C and the third semiconductor portion 14C around the p-n junction. The entirety of the third semiconductor portion 14C comprises the third semiconductor material and has a doping of the first conductivity type. The dopant concentration of the third semiconductor portion 14C is about the same as the dopant concentration of the semiconductor layer 12, e.g., $1.0 \times 10^{14}/cm^3$ to about $1.0 \times 10^{18}/cm^3$, and typically from about $1.0 \times 10^{15}/cm^3$ to about $1.0 \times 10^{17}/cm^3$, although lesser and greater concentrations are also contemplated herein.

A third floating drain 40C is formed on the opposite side of the third gate electrode structure 60C in the third pixel region 100C. The third floating drain 40C has a doping of the second conductivity type, and is electrically floating when a third transfer transistor, which comprises the third charge collection well 32C, the third floating drain 40C, a third channel therebetween, and the third gate electrode structure 60C, is turned off to enable storage of electrical charges. The third floating drain 40C may have the same doping and depth as the first floating drain 40A, and may be formed employing the same processing steps as the first floating drain 40A. Preferably, the third floating drain 40C is formed simultaneously with the first floating drain 40A.

The third semiconductor portion 14C and the third charge collection well 32C collectively constitute a third photosensitive diode (14C, 32C) that generates electron-hole pairs upon illumination. Charge carriers of the second conductivity type are collected in the third charge collection well 32C in proportion to the amount of photons impinging into the third photosensitive diode (14C, 32C). In case the first conductivity type is p-type and the second conductivity type is n-type, electrons are collected in the third charge collection well 32C. In case the first conductivity type is n-type and the second conductivity type is p-type, holes are collected in the third charge collection well 32C. A photon impinging on the third photosensitive diode (14C, 32C) generates an electron-hole pair if the photon interacts with the semiconductor material in the third photosensitive diode (14C, 32C).

The third semiconductor material is selected such that the band gap of the third semiconductor material is different from the band gap of the first semiconductor material and from the band gap of the second semiconductor material. Thus, the third photosensitive diode (14C, 32C) generates electron-hole pairs at a wavelength range that is different from the first wavelength range and the second wavelength range. The wavelength range that induces photogeneration of an electron-hole pair in the third photosensitive diode (14C, 32C) is herein referred to as a second wavelength range.

The operating principle of the third photosensitive diode (14C, 32C) is the same as the operating principle of the first photosensitive diode (14A, 32A) as described above except that the third wavelength range is shifted relative to the first wavelength range and the second wavelength range. For example, the first wavelength range may include yellow light, e.g., a wavelength around 575 nm, the second wavelength range may include red light, e.g., a wavelength around 680 nm, and the third wavelength range may include green light, e.g., a wavelength around 510 nm, so that the first photosensitive diode (14A, 32A), the second photosensitive diode (14B, 32B), and the third photosensitive diode (14C, 32C) are sensitive to light having different wavelengths and collectively form a color sensitive optical sensor unit.

The third transfer transistor is integrally formed with the third photosensitive diode (14C, 32C) such that the third charge collection well 32C is also a source of the third transfer transistor. The third transfer transistor operates in the same manner as the first transfer transistor.

An interconnect structure 98 including metal lines (not shown) and metal vias (not shown) are formed on the semiconductor substrate 8 and the first through third gate electrode structures (60A-60C) by methods known in the art. The interconnect structure 98 may comprise back-end-of-line (BEOL) interconnect layers 70, a first optical lens 72B, a second optical lens 72B, a third optical lens 72C, and an overlying dielectric layer 80. The first optical lens 72A is located above the BEOL interconnect layers 70 and overlies the first photosensitive diode (14A, 32A). The second optical lens 72B is located above the BEOL interconnect layers 70 and overlies the second photosensitive diode (14B, 32B). The third optical lens 72C is located above the BEOL interconnect layers 70 and overlies the third photosensitive diode (14C, 32C).

A first transparent optical path is provided from the top surface of the interconnect structure 98 through the first optical lens 72A to the first photosensitive diode (14A, 32A). A second transparent optical path is provided from the top surface of the interconnect structure 98 through the second optical lens 72B to the second photosensitive diode (14B, 32B). A third transparent optical path is provided from the top surface of the interconnect structure 98 through the third optical lens 72C to the third photosensitive diode (14C, 32C).

By employing different semiconductor materials in each of the three photosensitive diodes having different band gaps and correspondingly different wavelength ranges for photogeneration of charge carriers, the present invention enables a wavelength sensitive optical unit comprising multiple pixels that react to light of different wavelengths, and thereby enables a color-sensitive unit without employing any color filters. The band gaps and the wavelength ranges for photogeneration may be continuously modulated by employing alloys of semiconductor materials having different band gap energies. For example, silicon may be alloyed with germanium or carbon to modulate the band gap. Likewise, gallium arsenide may be alloyed with indium arsenide and/or gallium phosphide to continually alter the band gap as the composition of the compound semiconductor materials continually change.

Figure 8:
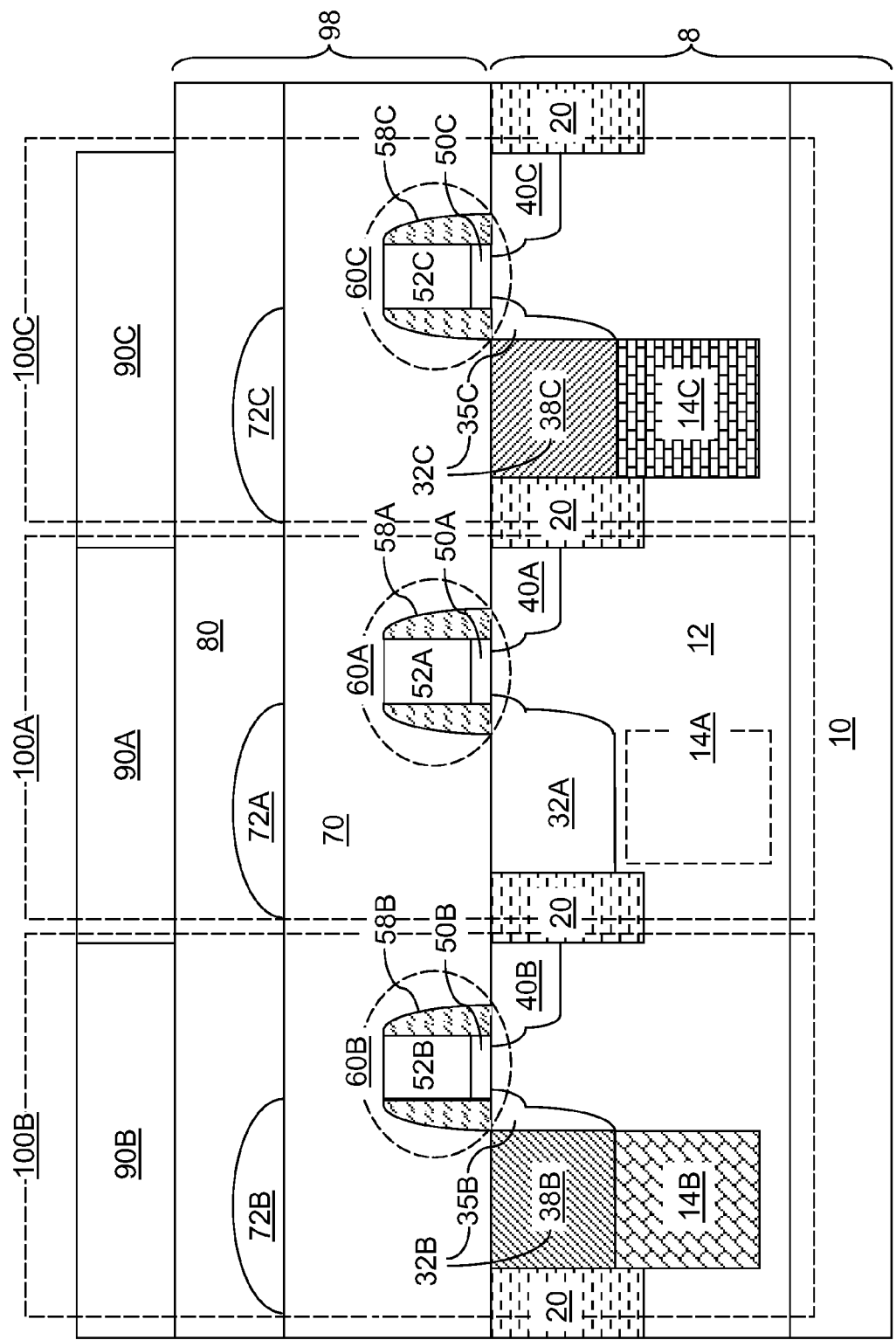
FIG. 8 is a vertical cross-sectional view of a variation of the first exemplary semiconductor structure after formation of color filters (90A, 90B, 90C).

Referring to FIG. 8, color filters may be added in a variation of the first exemplary semiconductor structure. Specifically, a first color filter 90A is formed over the first optical lens 72A and the first photosensitive diode (14A, 32A), a second color filter 90B is formed over the second optical lens 72B and the second photosensitive diode (14B, 32B), a third color filter 90C is formed over the third optical lens 72C and the third photosensitive diode (14C, 32C). Preferably, the pass band wavelength range for each of the color filters (90A-90C) matches with the sensitive band wavelength range for the underlying photosensitive diode to enhance the wavelength selectivity of each of the pixels. The combination of the photodiodes of the present invention and the color filters may provide enhanced wavelength sensitivity for each of the pixels.

Figure 9:
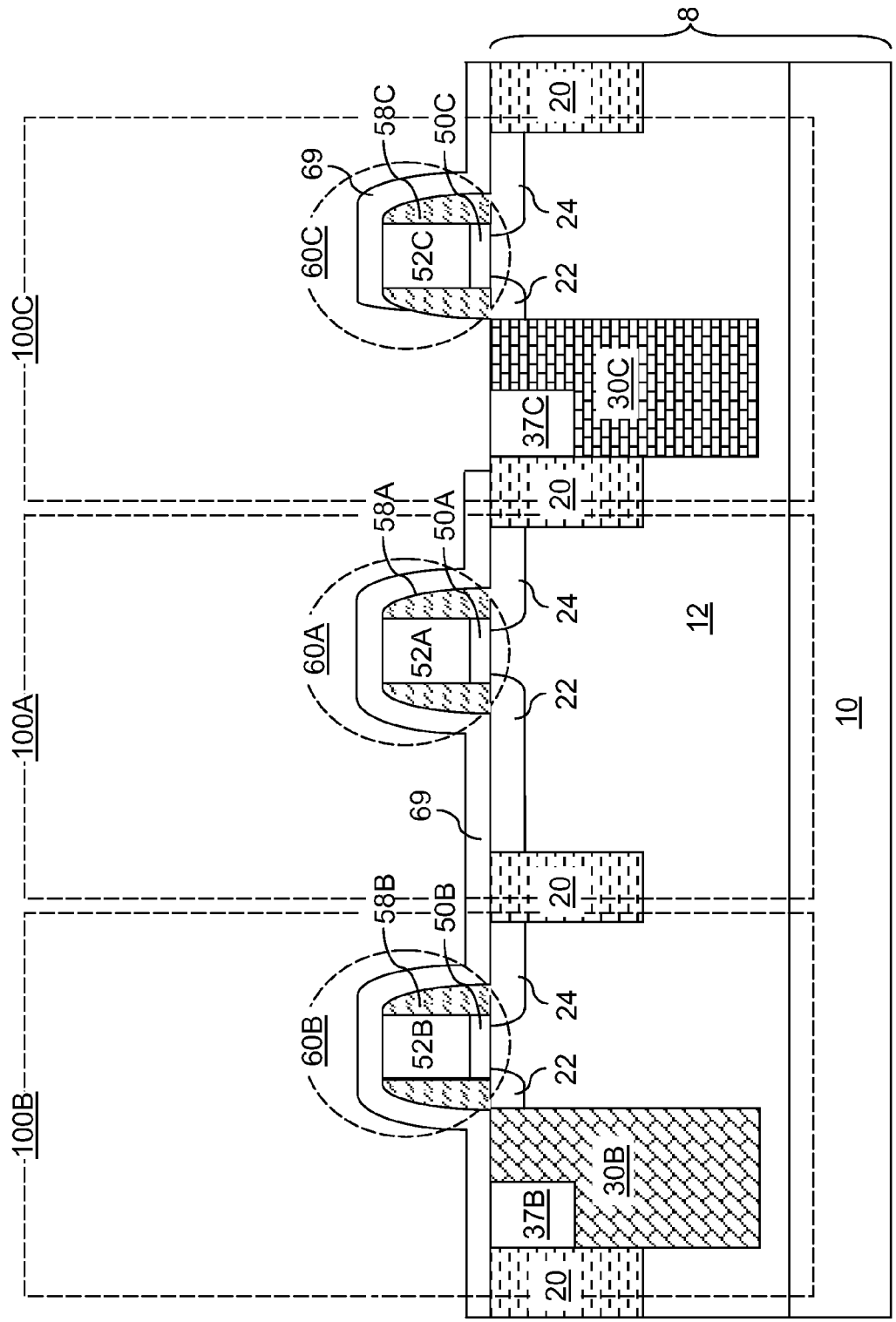
FIGS. 9 and 10 are sequential vertical cross-sectional views of a second exemplary semiconductor structure according to a second embodiment of the present invention.

Referring to FIG. 9, a second exemplary semiconductor structure according to a second embodiment of the present invention is derived from the first exemplary semiconductor structure of FIG. 3. Selective epitaxy is employed to fill the first trench 29B (See FIG. 3). Instead of filling the entirety of the first trench 29B with the second semiconductor material, a portion of the first trench 29B is filled with the second semiconductor material, followed by filling of a remaining portion of the first trench 29B with the first semiconductor material. The deposited second semiconductor material forms a second-semiconductor-material trench fill portion 30B, which abuts the semiconductor layer 12 along the entirety of a sidewall and a bottom surface. The deposited first semiconductor material forms a first epitaxial semiconductor material portion 37B comprising the first semiconductor material and laterally abutting one of the shallow trench isolation structures 20.

After formation of a second trench 29C (See FIG. 5) in the same manner as in the first embodiment, selective epitaxy is employed to fill the second trench 29C. Instead of filling the entirety of the second trench 29C with the third semiconductor material, a portion of the second trench 29C is filled with the third semiconductor material, followed by filling of a remaining portion of the second trench 29C with the first semiconductor material. The deposited third semiconductor material forms a third-semiconductor-material trench fill portion 30C, which abuts the semiconductor layer 12 along the entirety of a sidewall and a bottom surface. The deposited first semiconductor material forms a second epitaxial semiconductor material portion 37C comprising the first semiconductor material and laterally abutting one of the shallow trench isolation structures 20.

Filling of portions of the first trench 29B and the second trench 29C may reduce strain generated by the lattice mismatch between the first semiconductor material and the second or third semiconductor material. The reduction of the strain may be advantageously employed either to provide high quality epitaxial structures having few structural defects in the first and second trenches (29B, 29C). Alternatively, semiconductor materials having greater lattice mismatch may be employed for the second semiconductor material and/or the third semiconductor material if some of the strain may be alleviated through the use of the first and second epitaxial semiconductor material portions (37B, 37C).

Figure 10:
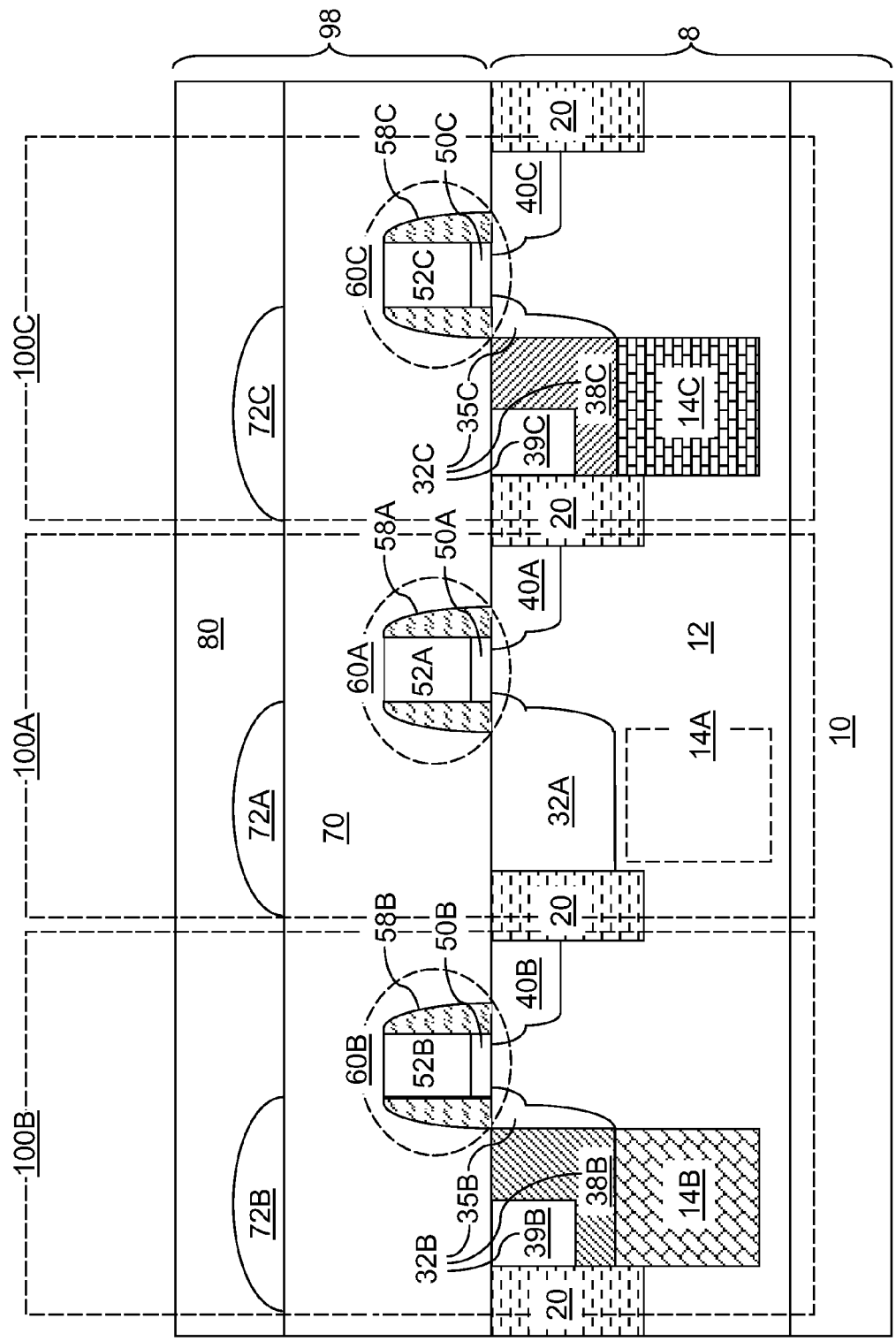

Referring to FIG. 10, processing steps of FIG. 7 are performed on the second exemplary semiconductor structure as in the first embodiment. After masked implantation of dopants of the second conductivity type, the first epitaxial semiconductor material portion 37B is doped with dopants of the second conductivity type to become a complementary first-semiconductor-material second charge collection well portion 39B. The portion of the semiconductor layer 12 in the second pixel region 100B that is implanted with the dopants of the second conductivity type and adjoining the second-semiconductor-material second charge collection well portion 38B is merged with a portion of the source extension region 22 in the second pixel region 100B to form a first-semiconductor-material second charge collection well portion 35B. The second-semiconductor-material second charge collection well portion 38B, the first-semiconductor-material second charge collection well portion 35B, and the complementary first-semiconductor-material second charge collection well portion 39B collectively constitute a second charge collection well 32B.

Likewise, the second epitaxial semiconductor material portion 37C is doped with dopants of the second conductivity type to become a complementary first-semiconductor-material third charge collection well portion 39C. The portion of the semiconductor layer 12 in the third pixel region 100C that is implanted with the dopants of the second conductivity type and adjoining the third-semiconductor-material third charge collection well portion 38C is merged with a portion of the source extension region 22 in the third pixel region 100C to form a first-semiconductor-material third charge collection well portion 35C. The third-semiconductor-material third charge collection well portion 38C, the first-semiconductor-material third charge collection well portion 35C, and the complementary first-semiconductor-material third charge collection well portion 39C collectively constitute a third charge collection well 32C.

Preferably, the distance between the bottom surface of the complementary first-semiconductor-material second charge collection well portion 39B and the p-n junction at the interface between the second-semiconductor-material second charge collection well portion 38B and the second semiconductor portion 14B is greater than the height of the depletion region in the second-semiconductor-material second charge collection well portion 38B. In other words, the depletion region above the p-n junction does not extend into the complementary first-semiconductor-material second charge collection well portion 39B. In this case, the optical properties of the second photosensitive diode (14B, 32B) are determined only by the optical properties of the second semiconductor material.

Likewise, the distance between the bottom surface of the complementary first-semiconductor-material third charge collection well portion 39C and the p-n junction at the interface between the third-semiconductor-material third charge collection well portion 38C and the third semiconductor portion 14C is greater than the height of the depletion region in the third-semiconductor-material third charge collection well portion 38C. In other words, the depletion region above the p-n junction does not extend into the complementary first-semiconductor-material third charge collection well portion 39C. In this case, the optical properties of the third photosensitive diode (14C, 32C) are determined only by the optical properties of the third semiconductor material.

The second exemplary semiconductor structure thus increases the range of lattice mismatch between the first semiconductor material and the second and/or third semiconductor materials. This feature may be advantageously employed to increase the separation between the first wavelength range and the second and/or third wavelength ranges in case the second and/or third semiconductor materials comprise alloys of the first semiconductor material and another semiconductor material. For example, in case the first semiconductor material comprises silicon, the second semiconductor material comprises a silicon germanium alloy, and the third semiconductor material comprises a silicon carbon alloy, higher percentage of germanium and/or carbon may be incorporated into the second semiconductor material and/or the third semiconductor material, respectively, thereby increasing the shift between the first wavelength range and the second and/or third wavelength ranges.

Figure 11:
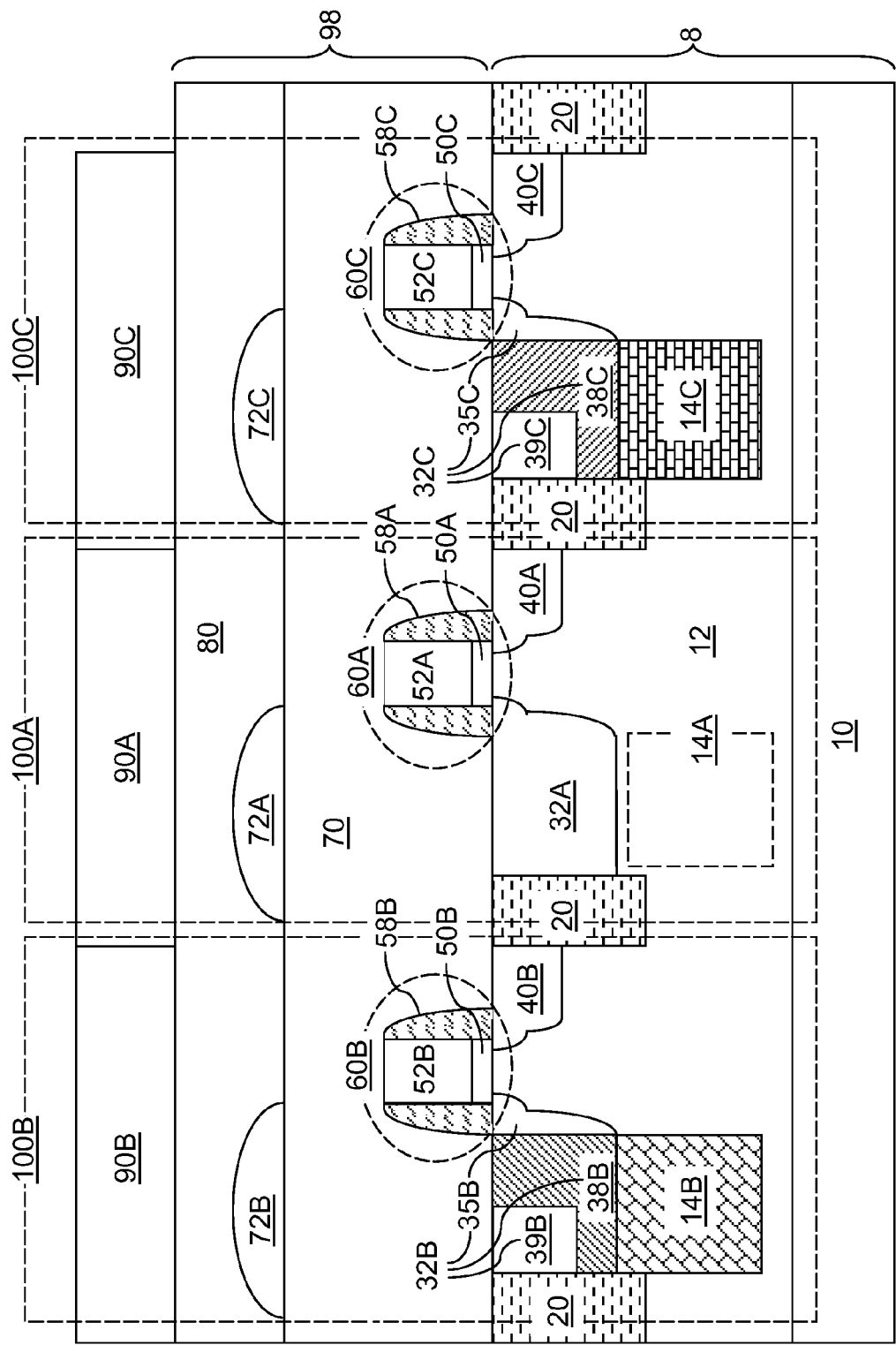
FIG. 11 is a vertical cross-sectional view of a variation of the second exemplary semiconductor structure after formation of color filters (90A, 90B, 90C).

Referring to FIG. 11, color filters may be added in a variation of the second exemplary semiconductor structure in the same manner as in the variation of the first exemplary semiconductor structure described above. Preferably, the pass band wavelength range for each of the color filters (90A-90C) matches with the sensitive band wavelength range for the underlying photosensitive diode to enhance the wavelength selectivity of each of the pixels. The combination of the photodiodes of the present invention and the color filters may provide enhanced wavelength sensitivity for each of the pixels.

Figure 12:
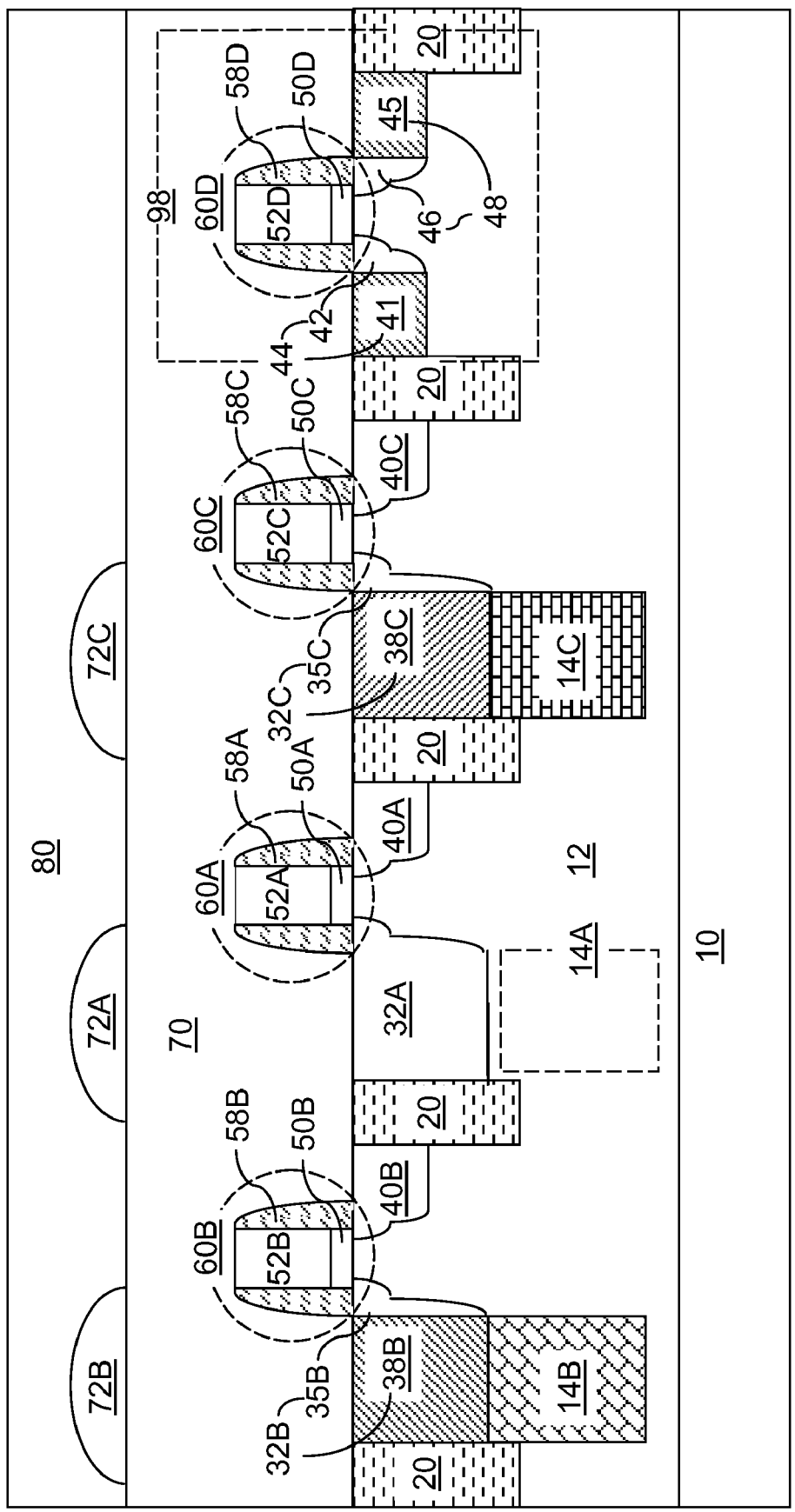
FIG. 12 is a vertical cross-sectional view of a third exemplary semiconductor structure according to a third embodiment of the present invention.

Referring to FIG. 12, a vertical cross-sectional view of a third exemplary semiconductor structure according to a third embodiment of the present invention is provided, which may be manufactured by forming a field effect transistor 98 comprising a gate electrode structure 60D, a source region 44, and a drain region 48 formed in a semiconductor substrate. The field effect transistor 98 may be a p-type field effect transistor or an n-type field effect transistor. The field effect transistor 98 may be formed directly on the semiconductor layer 12, or may be formed in a doped well (not shown) having an opposite conductivity type as the semiconductor layer 12.

The gate electrode structure 60D comprises a fourth gate dielectric 50D, a fourth gate conductor 52D, and a fourth gate spacer 58D. The source region 44 comprises a second-semiconductor-material source portion 41 comprising the second semiconductor material and a first-semiconductor-material source portion 42 comprising the first semiconductor material. The drain region 48 comprises a second-semiconductor-material drain portion 45 comprising the second semiconductor material and a first-semiconductor-material drain portion 46 comprising the first semiconductor material. The second semiconductor material is embedded into the source region 44 and the drain region 48, preferably with epitaxial alignment with the semiconductor layer 12, so that a compressive stress or a tensile stress is applied to the channel between the source region 44 and the drain region 48. Such a compressive or tensile stress may be advantageously employed to enhance the carrier mobility and the on-current of the field effect transistor 98.

According to the third embodiment of the present invention, a source trench and a drain trench may be formed by lithographic methods and etching and filled simultaneously with the formation of the second-semiconductor-material trench fill portion 30B, thereby forming the second-semiconductor-material source portion 41 and the second-semiconductor-material drain portion 45. In other words, the formation of the second-semiconductor-material trench fill portion 30B may be integrated into the processing steps employed to deposit the second-semiconductor-material source portion 41 and the second-semiconductor-material drain portion 45, thereby effectively forming the second-semiconductor-material trench fill portion 30B with minimal additional processing steps.

Figure 13:
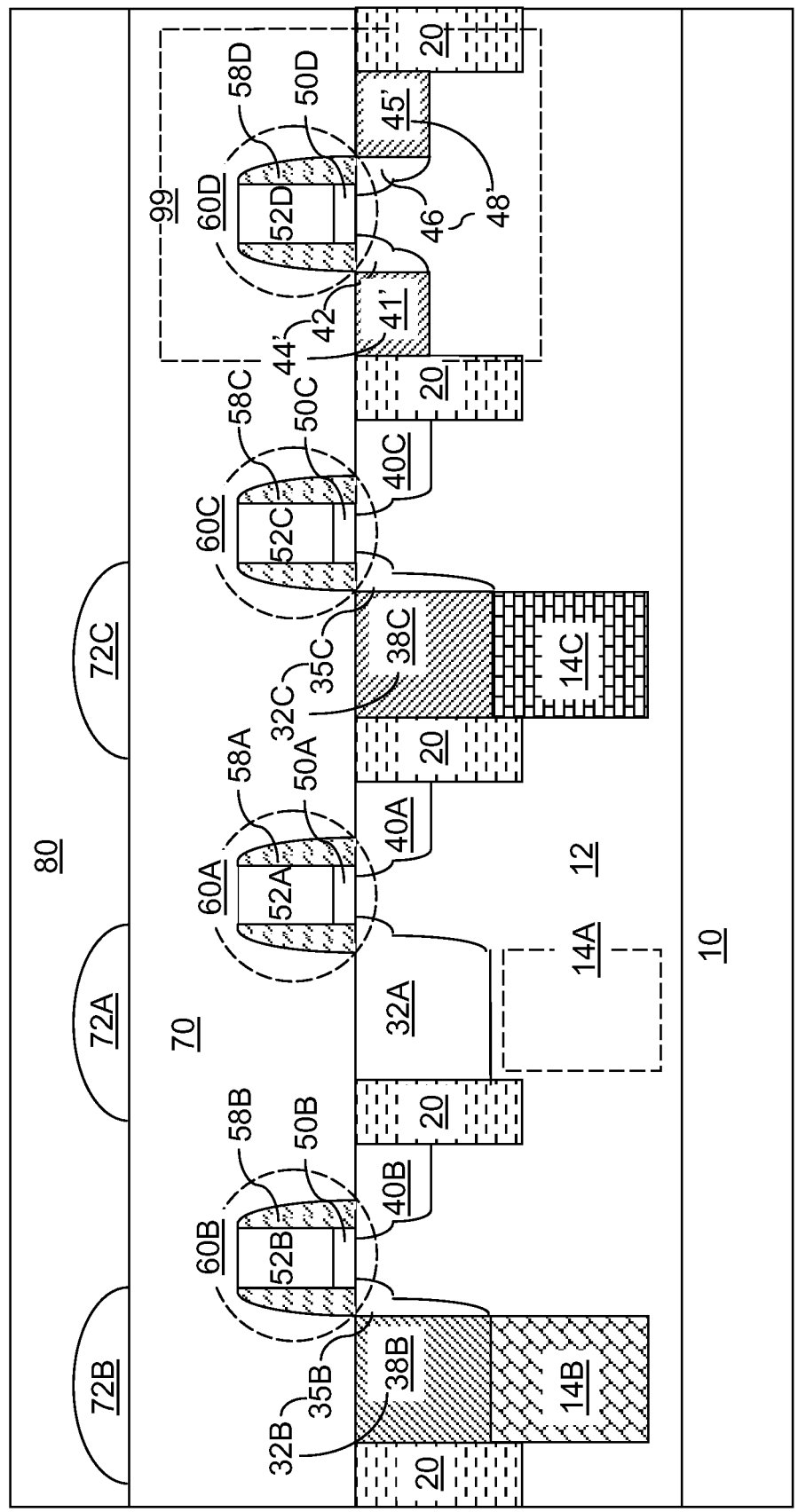
FIG. 13 is a vertical cross-sectional view of a fourth exemplary semiconductor structure according to a fourth embodiment of the present invention.

Referring to FIG. 13, a vertical cross-sectional view of a fourth exemplary semiconductor structure according to a fourth embodiment of the present invention is provided, which may be manufactured by forming a field effect transistor 99 comprising a gate electrode structure 60D, a source region 44', and a drain region 48' formed in a semiconductor substrate. The field effect transistor 99 may be a p-type field effect transistor or an n-type field effect transistor. The field effect transistor 99 may be formed directly on the semiconductor layer 12, or may be formed in a doped well (not shown) having an opposite conductivity type as the semiconductor layer 12.

The gate electrode structure 60D comprises a fourth gate dielectric 50D, a fourth gate conductor 52D, and a fourth gate spacer 58D. The source region 44' comprises a third-semiconductor-material source portion 41' comprising the third semiconductor material and a first-semiconductor-material source portion 42 comprising the first semiconductor material. The drain region 48' comprises a third-semiconductor-material drain portion 45' comprising the third semiconductor material and a first-semiconductor-material drain portion 46 comprising the first semiconductor material. The third semiconductor material is embedded into the source region 44' and the drain region 48', preferably with epitaxial alignment with the semiconductor layer 12, so that a compressive stress or a tensile stress is applied to the channel between the source region 44' and the drain region 48'. Such a compressive or tensile stress may be advantageously employed to enhance the carrier mobility and the on-current of the field effect transistor 99.

According to the fourth embodiment of the present invention, a source trench and a drain trench may be formed by lithographic methods and etching and filled simultaneously with the formation of the third-semiconductor-material trench fill portion 30C, thereby forming the third-semiconductor-material source portion 41' and the third-semiconductor-material drain portion 45'. The third-semiconductor-material trench fill portion 30C may be formed with minimal additional processing steps in a manner similar to the third embodiment.

Figure 14:
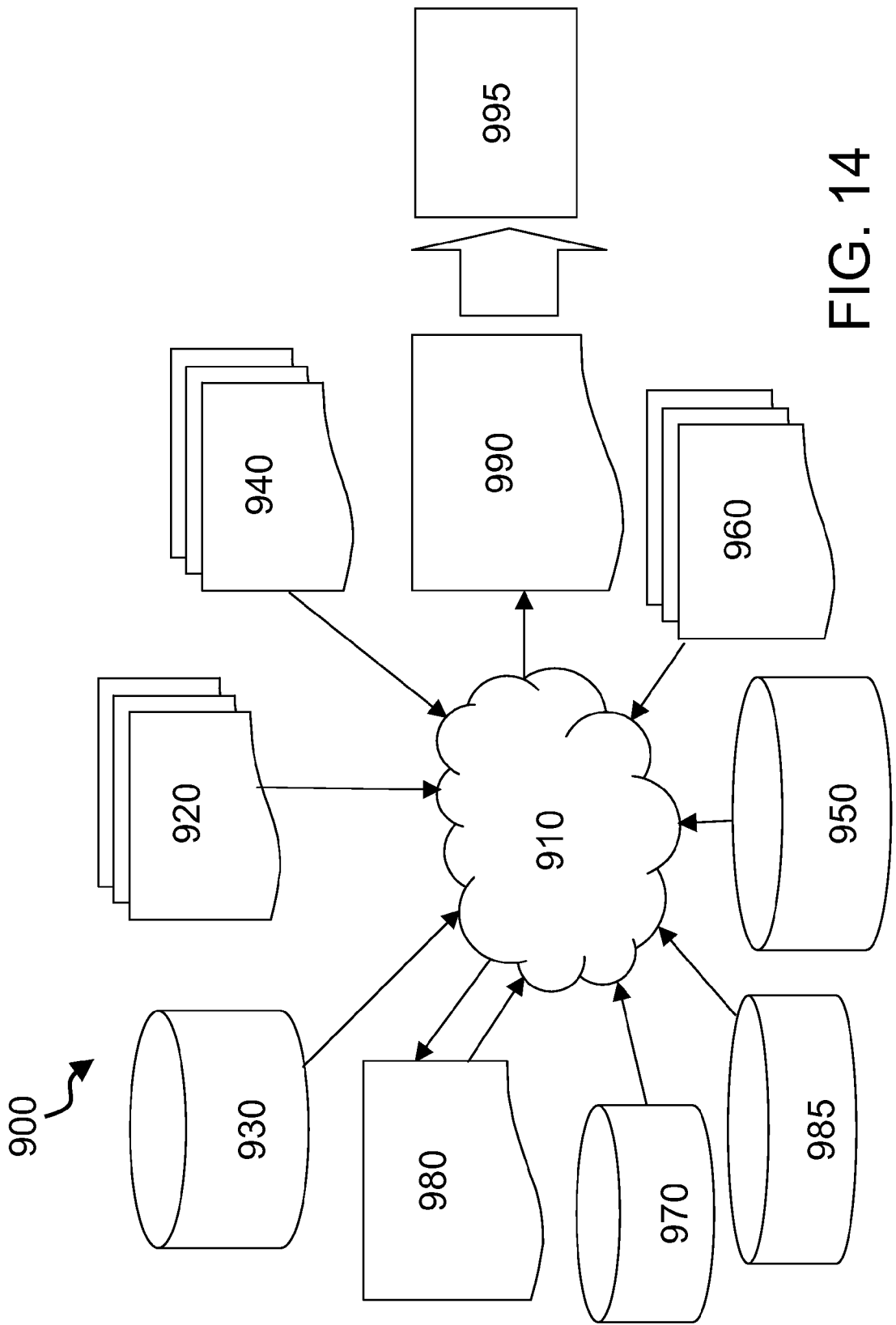
FIG. 14 is a flow diagram of a design process used in semiconductor design and manufacture of the semiconductor structures according to the present invention.

FIG. 14 shows a block diagram of an exemplary design flow 900 used for example, in semiconductor design and manufacturing of the semiconductor circuit according to the present invention. Design flow 900 may vary depending on the type of integrated circuit (IC) being designed. For example, a design flow for building an application specific integrated circuit (ASIC) may differ from a design flow for designing a standard integrated circuit component. Design structure 920 is preferably an input to a design process 910 and may come from an intellectual property (IP) provider, a core developer, or a design company, or may be generated by the operator of a design flow, or may come from other sources.

Design structure 920 comprises an embodiment of present invention as shown in any of FIGS. 2-13 in the form of schematics or hardware description language (HDL; e.g. Verilog, VHDL, C, C++, etc.) The design structure 920 may be contained on one or more machine readable medium. For example, design structure 920 may be a text file or a graphical representation of an embodiment of the invention as shown in FIGS. 2-13.

Design process 910 preferably synthesizes (or translates) an embodiment of the invention as show in FIGS. 2-13 into a netlist 980, where netlist 980 is, for example, a list of metal light shields, wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which the netlist 980 is resynthesized one or more times depending on design specifications and parameters for the circuit.

The design process 910 may include using a variety of inputs; for example, inputs from library elements 930 which may house a set of commonly used elements, circuits, and devices, including models, layouts, and symbolic representations, for a given manufacturing technology (e.g., different technology nodes such as 32 nm, 45 nm, and 90 nm, etc.), design specifications 940, characterization data 950, verification data 960, design rules 970, and test data files 985 (which may include, for example, standard circuit design processes such as timing analysis, verification, design rule checking, place and route operations, etc. One of ordinary skill in the art of integrated circuit design can appreciate the extent of possible electronic design automation tools and applications used in the design process 910 without deviating from the scope and spirit of the present invention. The design structure of the present invention is not limited to any specific design flow.

Design process 910 preferably translates an embodiment of the invention as shown in FIGS. 2-13, along with any additional integrated circuit deign or data (if applicable), into a second design structure 990. Design structure 990 resides on a storage medium in a data format used for the exchange of layout data of integrated circuits and/or symbolic data format (e.g., information stored in GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing though the manufacturing line, and any other data required by a semiconductor manufacturer to produce one of the embodiments of the present invention as shown in FIGS. 2-13. Design structure 990 may then proceed to a stage 995 where, for example, design structure 990 proceeds to tape-out, is released to manufacturing, is released to a mask house, is sent to another design house, is sent back to a customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
   providing a semiconductor substrate including a semiconductor layer comprising a first semiconductor material and having a doping of a first conductivity type;
   forming a first photosensitive diode in said semiconductor substrate, wherein said first photosensitive diode comprises a first charge collection well and a first semiconductor portion that is a portion of said semiconductor layer, wherein said first semiconductor portion is formed directly underneath said first charge collection well, comprises said first semiconductor material, and has a doping of said first conductivity type, wherein said first charge collection well comprises said first semiconductor material and has a doping of a second conductivity type, wherein said second conductivity type is the opposite of said first conductivity type; and
   forming a second photosensitive diode in said semiconductor substrate, wherein said second photosensitive diode comprises a second charge collection well and a second semiconductor portion, wherein said second semiconductor portion is formed directly underneath said second charge collection well, comprises a second semiconductor material having a different composition than said first semiconductor material, has a doping of said first conductivity type, and contacts said first semiconductor material in said semiconductor layer, wherein said second charge collection well comprises said second semiconductor material and has a doping of said second conductivity type.

2. The method of forming a semiconductor structure according to claim 1, further comprising:
   forming a trench in said semiconductor substrate, wherein sidewalls comprising said first semiconductor material of said semiconductor layer are exposed; and
   depositing said second semiconductor material having a doping of said first conductivity type in said trench in epitaxial alignment with said semiconductor layer.

3. The method of forming a semiconductor structure according to claim 2, further comprising implanting dopants of said second conductivity into an upper portion of said second semiconductor material in said trench, wherein a p-n junction is formed within said second semiconductor material in said trench, wherein said second semiconductor material in said trench above said p-n junction constitutes said second charge collection well, and wherein said second semiconductor material in said trench below said p-n junction constitutes said second semiconductor portion.

4. The method of forming a semiconductor structure according to claim 3, further comprising:
   forming a gate electrode structure and a shallow trench isolation structure on said semiconductor substrate; and
   forming a hard mask layer on said gate electrode and said shallow trench isolation structure.

5. The method of forming a semiconductor structure according to claim 4, further comprising:
   forming an opening in said hard mask layer between said gate electrode and said shallow trench isolation structure; and
   etching a portion of said semiconductor layer underneath said opening, wherein said trench is formed by said etching.

6. The method of forming a semiconductor structure according to claim 1, further comprising:
   forming an interconnect structure on said first photosensitive diode and said second photosensitive diode, wherein said interconnect structure includes transparent optical paths from a top surface of said interconnect structure to each of said first photosensitive diode and said second photosensitive diode; and
   forming an optical lens in each of said transparent optical paths.

7. The method of forming a semiconductor structure according to claim 1, further comprising:
   forming a first color filter above said first photosensitive diode; and
   forming a second color filter above said second photosensitive diode, wherein said first photosensitive diode and said second photosensitive filters comprise different materials and transmit light for different wavelength ranges.

8. The method of forming a semiconductor structure according to claim 1, wherein said second semiconductor material is a semiconducting alloy of said first semiconductor material and another material.

9. The method of forming a semiconductor structure according to claim 8, wherein said second semiconductor material is a silicon germanium alloy or a silicon carbon alloy.

10. The method of forming a semiconductor structure according to claim 1, wherein said first charge collection well, said first semiconductor portion, said second charge collection well, and a second semiconductor portion are epitaxially aligned among one another.

11. The method of forming a semiconductor structure according to claim 1, wherein said semiconductor substrate includes a semiconductor layer having a doping of said first conductivity type and comprising said first semiconductor material, wherein said first charge collection well, said first semiconductor portion, said second charge collection well, and a second semiconductor portion are embedded in said semiconductor layer in epitaxial alignment with said semiconductor layer.

12. The method of forming a semiconductor structure according to claim 1, further comprising forming an interconnect structure on said first photosensitive diode and said second photosensitive diode, wherein said interconnect structure includes transparent optical paths from a top surface of said interconnect structure to each of said first photosensitive diode and said second photosensitive diode.

13. The method of forming a semiconductor structure according to claim 12, further comprising forming an optical lens located in each of said transparent optical paths.

14. The method of forming a semiconductor structure according to claim 5, further comprising:
   forming a first color filter above said first photosensitive diode;
   forming a second color filter above said second photosensitive diode, wherein said first photosensitive diode and said second photosensitive filters comprise different materials and transmit light for different wavelength ranges.

15. The method of forming a semiconductor structure according to claim 1, further comprising:
   forming a first transfer transistor of integral construction with said first photosensitive diode, wherein said first charge collection well is a source region of said first transfer transistor; and
   forming a second transfer transistor of integral construction with said second photosensitive diode, wherein said second charge collection well is a source region of said second transfer transistor.

16. The method of forming a semiconductor structure according to claim 1, further comprising forming shallow trench isolation structures, wherein said first semiconductor portion and said second semiconductor portion extends beneath a bottom surface of said shallow trench isolation structures.

17. The method of forming a semiconductor structure according to claim 1, further comprising forming an epitaxial semiconductor material portion comprising said first semiconductor material and having a doping of said second conductivity type directly on said second charge collection well and a shallow trench isolation structure.

18. The method of forming a semiconductor structure according to claim 1, further comprising forming a third photosensitive diode in said semiconductor substrate, wherein said third photosensitive diode comprises a third charge collection well and a third semiconductor portion, wherein said third semiconductor portion is formed directly underneath said third charge collection well, comprises a third semiconductor material, and has a doping of said first conductivity type, wherein said third charge collection well comprises said third semiconductor material and has a doping of said second conductivity type, and wherein said third semiconductor material is different from said first semiconductor material and said second semiconductor material.

19. The method of forming a semiconductor structure according to claim 18, wherein said second semiconductor material is a first semiconducting alloy of said first semiconductor material and another material and said third semiconductor material is a second semiconducting alloy of said first semiconductor material and yet another material.

20. The method of forming a semiconductor structure according to claim 19, wherein said first semiconductor material is silicon, said second semiconductor material is a silicon germanium alloy, and said third semiconductor material is a silicon carbon alloy.

* * * * *